(12) United States Patent
Nakada et al.

(10) Patent No.: US 9,899,626 B2
(45) Date of Patent: Feb. 20, 2018

(54) LIGHT-EMITTING DEVICE

(71) Applicant: SEMICONDUCTOR ENERGY LABORATORY CO., LTD., Atsugi-shi, Kanagawa-ken (JP)

(72) Inventors: Masataka Nakada, Tochigi (JP); Takayuki Abe, Tochigi (JP); Naoyuki Senda, Kanagawa (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 217 days.

(21) Appl. No.: 14/632,115

(22) Filed: Feb. 26, 2015

(65) Prior Publication Data

US 2015/0255740 A1 Sep. 10, 2015

(30) Foreign Application Priority Data

Mar. 6, 2014 (JP) .................. 2014-043742

(51) Int. Cl.
*H01L 51/52* (2006.01)
*H01L 51/00* (2006.01)
*H01L 27/32* (2006.01)

(52) U.S. Cl.
CPC ...... *H01L 51/5246* (2013.01); *H01L 51/0097* (2013.01); *H01L 51/524* (2013.01);
(Continued)

(58) Field of Classification Search
CPC ......... H01L 51/0097; H01L 2251/5338; H01L 27/28; H01L 27/283; H01L 27/32;
(Continued)

(56) References Cited

U.S. PATENT DOCUMENTS 6,645,830 B2   11/2003 Shimoda et al.
7,045,438 B2    5/2006 Yamazaki et al.
(Continued)

FOREIGN PATENT DOCUMENTS

CN   001397984 A   2/2003
CN   001890787 A   1/2007
(Continued)

OTHER PUBLICATIONS

International Search Report (Application No. PCT/IB2015/051410) dated Jun. 9, 2015.
(Continued)

*Primary Examiner* — Fei Fei Yeung Lopez
(74) *Attorney, Agent, or Firm* — Nixon Peabody LLP; Jeffrey L. Costellia

(57) ABSTRACT

A flexible device with fewer defects caused by a crack is provided. A flexible device with high productivity is also provided. Furthermore, a flexible device with less display failure even in a high temperature and high humidity environment is provided. A light-emitting device includes a first flexible substrate, a second flexible substrate, a buffer layer, a first crack inhibiting layer, and a light-emitting element. A first surface of the first flexible substrate faces a second surface of the second flexible substrate. The buffer layer and the first crack inhibiting layer are provided over the first surface of the first flexible substrate. The buffer layer overlaps with the first crack inhibiting layer. The light-emitting element is provided over the second surface of the second flexible substrate.

20 Claims, 21 Drawing Sheets

(52) U.S. Cl.
CPC ...... *H01L 51/5237* (2013.01); *H01L 51/5243* (2013.01); *H01L 27/323* (2013.01); *H01L 2251/5338* (2013.01); *Y02E 10/549* (2013.01)

(58) Field of Classification Search
CPC .............. H01L 51/524; H01L 51/5237; H01L 51/5243; H01L 51/5246
USPC ........ 257/59, 72, 40, 797, E51.018, E51.022
See application file for complete search history.

(56) References Cited

U.S. PATENT DOCUMENTS

| | | | |
|---|---|---|---|
| 7,868,957 B2* | 1/2011 | Yamazaki | H01L 21/28008 349/43 |
| 8,047,442 B2 | 11/2011 | Yamazaki et al. | |
| 8,228,453 B2 | 7/2012 | Yamazaki et al. | |
| 8,367,440 B2 | 2/2013 | Takayama et al. | |
| 8,415,208 B2 | 4/2013 | Takayama et al. | |
| 8,482,196 B2 | 7/2013 | Moriwaki | |
| 8,619,219 B2 | 12/2013 | Yamazaki et al. | |
| 8,936,952 B2 | 1/2015 | Chida | |
| 9,024,524 B2 | 5/2015 | Moriwaki | |
| 9,202,987 B2 | 12/2015 | Takayama et al. | |
| 9,608,004 B2 | 3/2017 | Takayama et al. | |
| 2003/0032210 A1* | 2/2003 | Takayama | H01L 21/76251 438/30 |
| 2007/0085112 A1* | 4/2007 | Yamazaki | H01L 21/28008 257/288 |
| 2007/0153056 A1* | 7/2007 | Lee | B41J 2/145 347/47 |
| 2010/0301742 A1* | 12/2010 | Moriwaki | H01L 51/5237 313/504 |
| 2011/0147789 A1* | 6/2011 | Lee | H01L 51/5253 257/100 |
| 2011/0318889 A1 | 12/2011 | Chida | |
| 2013/0299789 A1* | 11/2013 | Yamazaki | H01L 51/5246 257/40 |
| 2014/0034994 A1 | 2/2014 | Yamane et al. | |
| 2014/0306288 A1 | 10/2014 | Adachi et al. | |
| 2015/0102300 A1* | 4/2015 | Gong | H01L 51/5246 257/40 |
| 2017/0047358 A1 | 2/2017 | Takayama et al. | |

FOREIGN PATENT DOCUMENTS

| | | |
|---|---|---|
| CN | 101901879 A | 12/2010 |
| CN | 103493589 A | 1/2014 |
| JP | H10-125931 | 5/1998 |
| JP | 2003-174153 | 6/2002 |
| JP | 2009-210719 A | 9/2009 |
| JP | 4332577 | 9/2009 |
| JP | 2010-224426 A | 10/2010 |
| JP | 2011-107556 A | 6/2011 |
| JP | 2012-028761 A | 2/2012 |
| KR | 2012-0000497 A | 1/2012 |
| KR | 2014-0066974 A | 6/2014 |
| WO | WO-2005/055309 | 6/2005 |
| WO | WO-2013/046545 | 4/2013 |

OTHER PUBLICATIONS

Written Opinion (Application No. PCT/IB2015/051410) dated Jun. 9, 2015.
Chinese Office Action (Application No. 201580012233.6) dated Sep. 15, 2017.

* cited by examiner

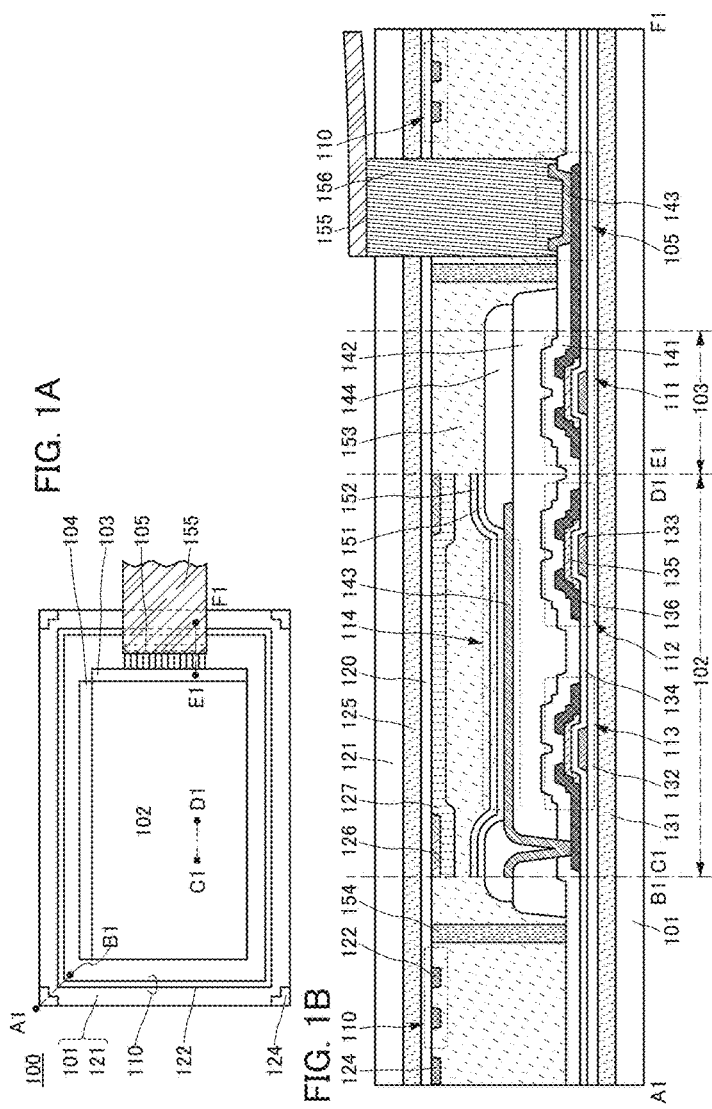

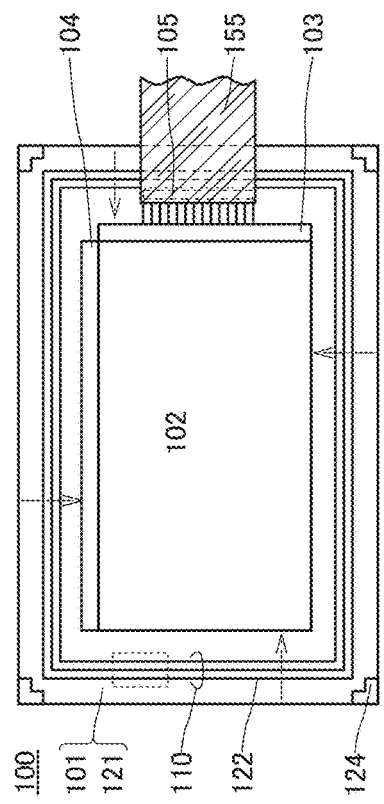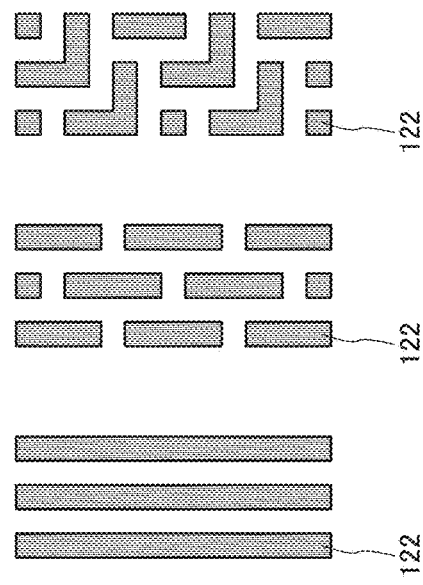

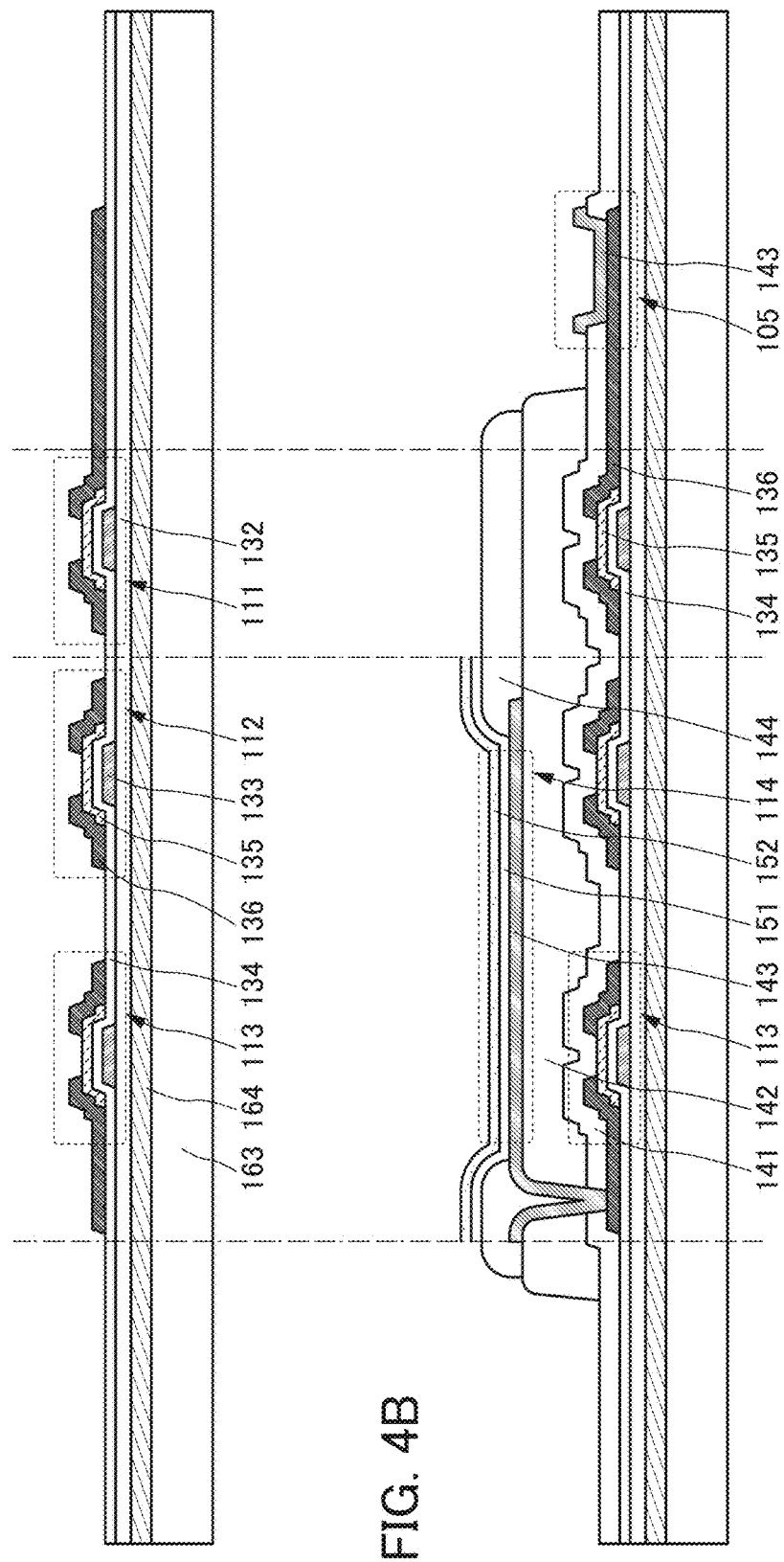

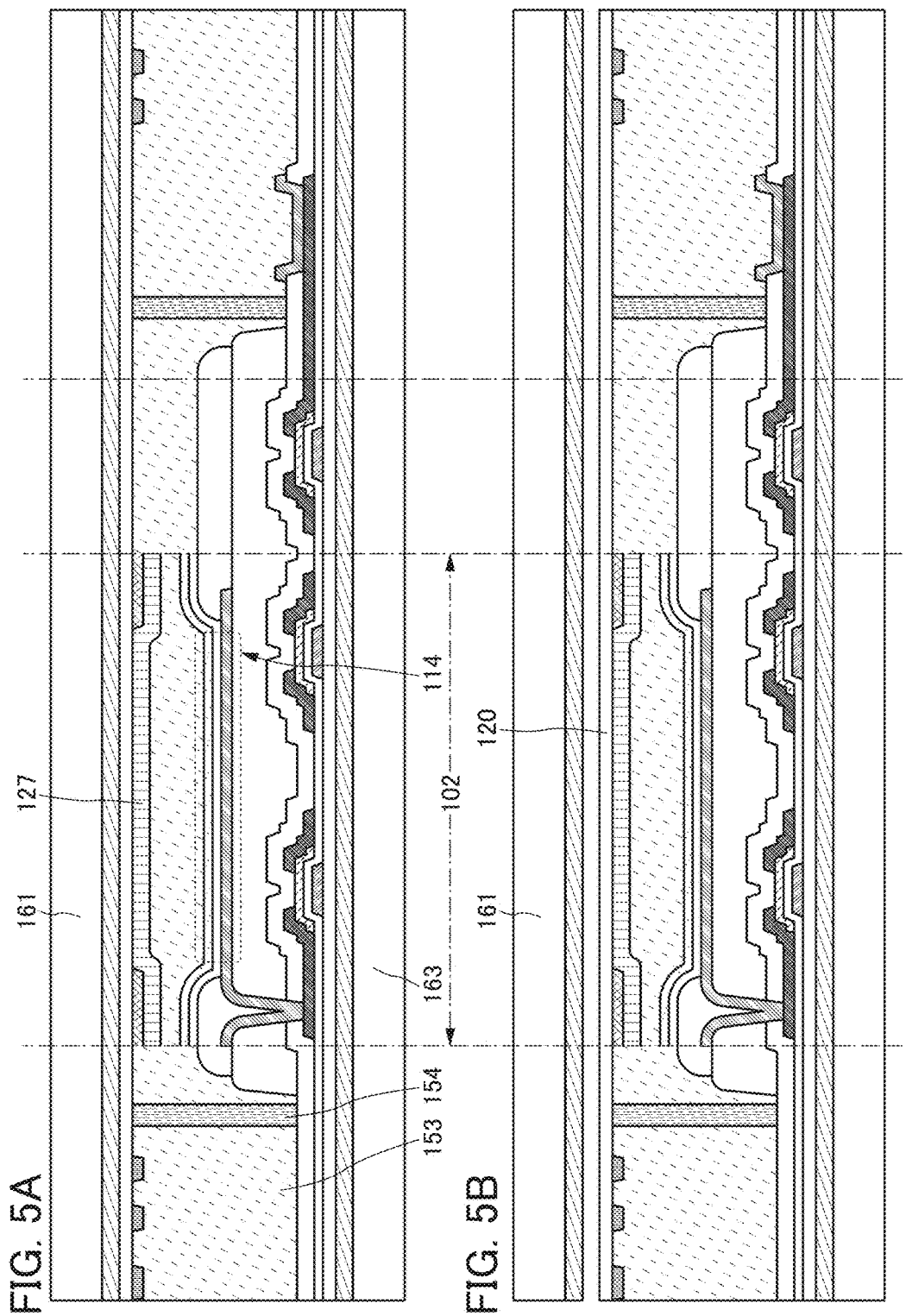

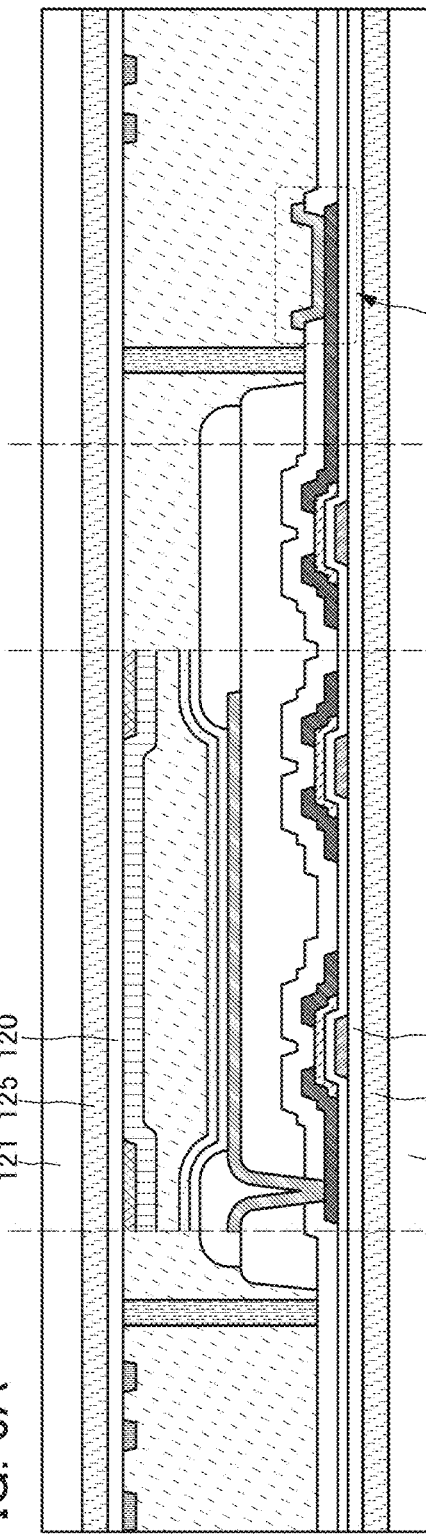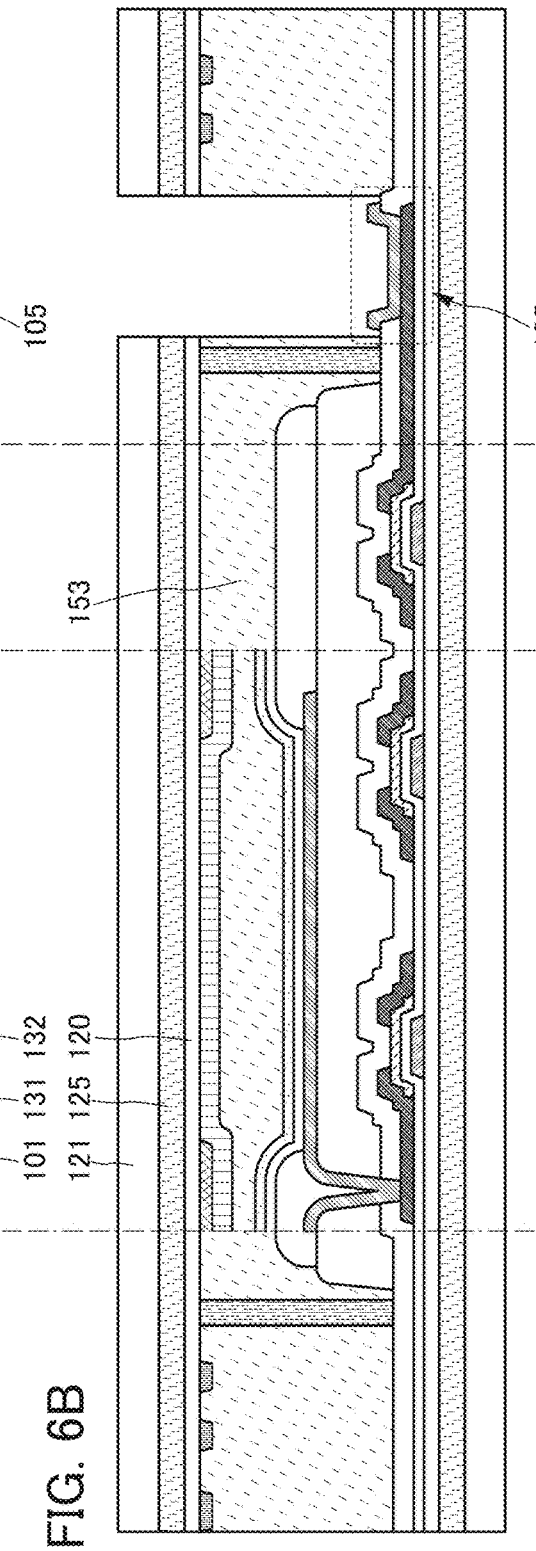

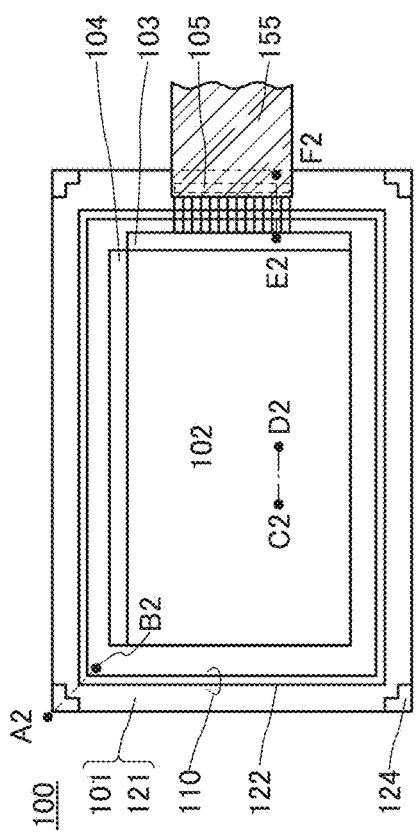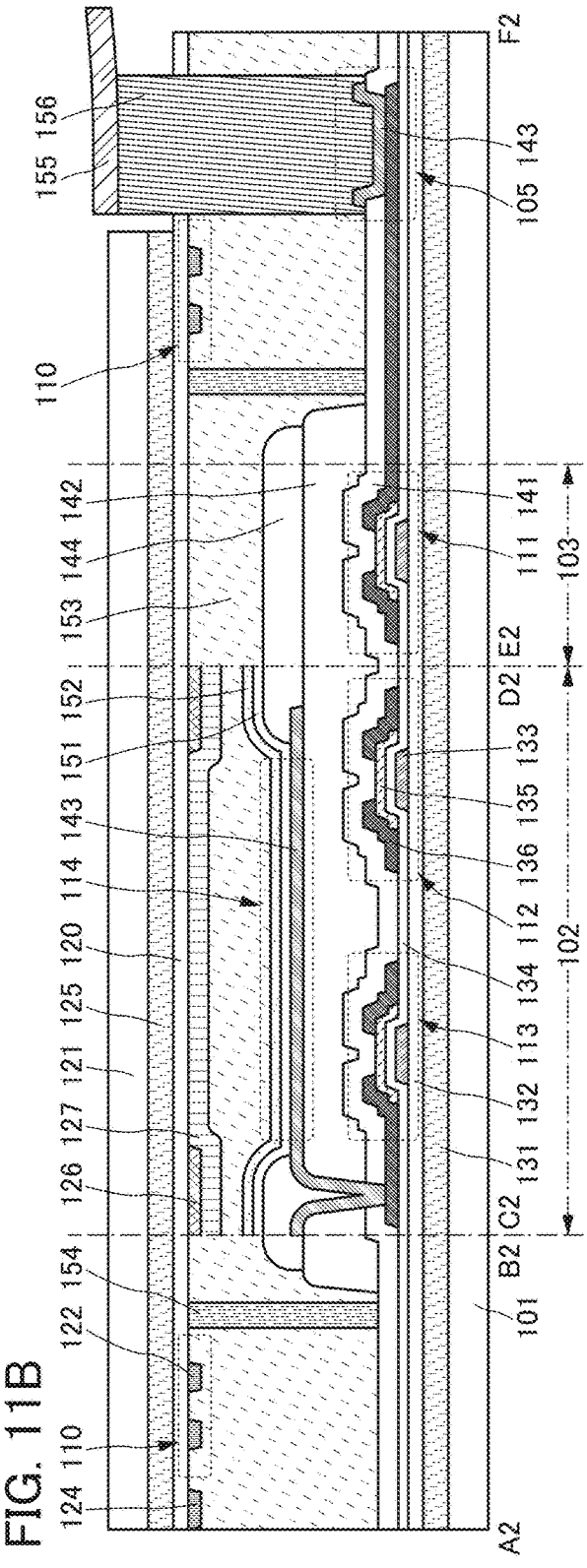

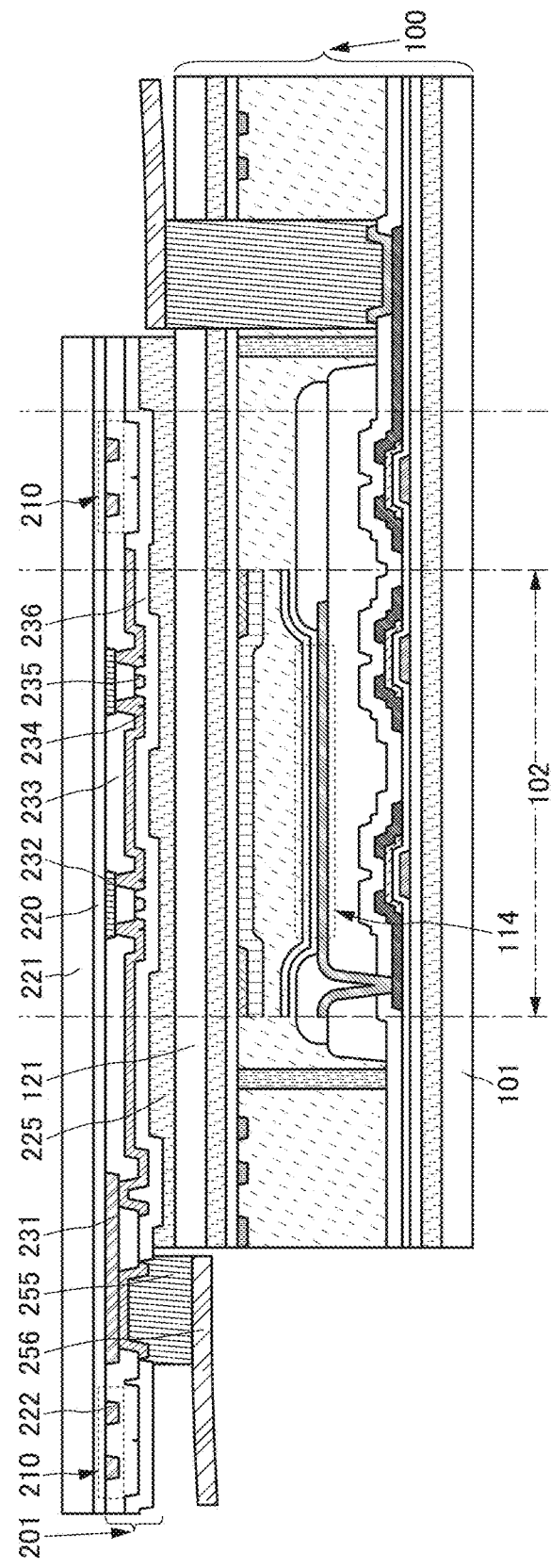

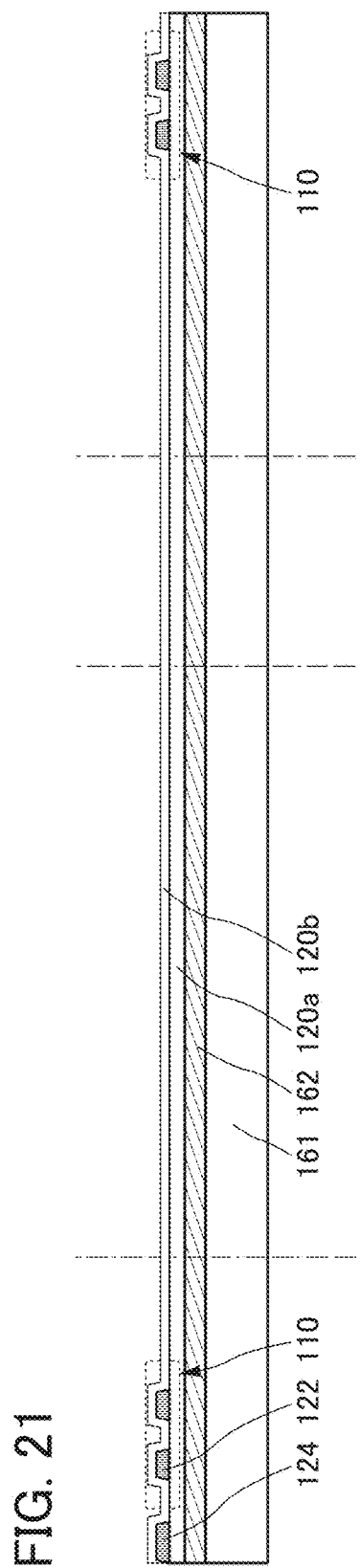

LIGHT-EMITTING DEVICE

TECHNICAL FIELD

One embodiment of the present invention relates to a display device, and particularly to a flexible display device capable of performing display along a curved surface. One embodiment of the present invention also relates to a light-emitting device, and particularly to a flexible light-emitting device capable of performing light emission along a curved surface.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, an electronic device, a method for driving any of them, and a method for manufacturing any of them.

BACKGROUND ART

In recent years, a flexible device has been developed; in the flexible device, a semiconductor element, a light-emitting element, and the like are provided over a flexible substrate. Typical examples of the flexible device include, as well as a lighting device and an image display device, a variety of semiconductor circuits including a semiconductor element such as a transistor.

As a method of manufacturing a semiconductor device including a flexible substrate, the following technique has been developed: a semiconductor element such as a thin film transistor (TFT) is formed over a support substrate (e.g., a glass substrate or a quartz substrate), and then the semiconductor element is transferred to a flexible substrate. This technique needs a step of separating a layer including the semiconductor element from the support substrate.

For example, Patent Document 1 discloses a separating technique using laser ablation as follows. A separation layer formed of amorphous silicon or the like is formed over a substrate, a layer to be separated is formed over the separation layer, and the layer to be separated is bonded to a transfer body with a bonding layer. The separation layer is ablated by laser irradiation, so that peeling occurs in the separation layer.

Patent Document 2 discloses a separating technique as follows. A metal layer is formed between a substrate and an oxide layer and peeling is performed at the interface between the oxide layer and the metal layer by utilizing weak bonding at the interface, so that a layer to be separated and the substrate are separated from each other.

REFERENCES

Patent Documents

[Patent Document 1] Japanese Published Patent Application No. H10-125931
[Patent Document 2] Japanese Published Patent Application No. 2003-174153

DISCLOSURE OF INVENTION

In the case where peeling is performed between a separation layer provided over a substrate and a layer to be separated (hereinafter also referred to as a buffer layer) formed over the separation layer, a stack of thin films (e.g., the layer to be separated, a thin film transistor, a wiring, and an interlayer film) is provided over the separation layer. The stack has a thickness of several micrometers or less and is very fragile in some cases. When peeling is performed between the separation layer and the layer to be separated, a high bending stress is applied to an end portion of the substrate (a separation starting point); as a result, breaking or cracking (hereinafter, collectively referred to as a crack) easily occurs in the layer to be separated.

To improve the productivity of flexible light-emitting devices, it is preferable that a plurality of light-emitting devices be manufactured at a time over a large substrate and the substrate be divided with a scriber or the like. At this time, due to stress applied when the substrate is divided, a crack might occur in a thin film in an end portion of the substrate, particularly in the layer to be separated.

In addition, when the flexible light-emitting device that is manufactured in the aforementioned separating and dividing steps is held in a high temperature and high humidity environment, the crack, which has occurred in the end portion of the layer to be separated in the separating and dividing steps, develops in some cases. The development of the crack reduces the reliability of light-emitting elements in the light-emitting device, or some of the light-emitting element emit no light because of the crack reaching the light-emitting elements.

In view of the above, an object of one embodiment of the present invention is to provide a flexible light-emitting device with fewer defects caused by a crack. Another object is to provide a flexible light-emitting device with high productivity. Still another object is to provide a light-emitting device with high reliability.

Alternatively, an object of one embodiment of the present invention is to provide a novel light-emitting device. Another object of one embodiment of the present invention is to provide a lightweight light-emitting device. Still another object of one embodiment of the present invention is to provide a light-emitting device that is less likely to be broken. Still further object of one embodiment of the present invention is to provide a thin light-emitting device.

In one embodiment of the present invention, there is no need to achieve all the objects. Note that the description of these objects does not disturb the existence of other objects. Other objects will be apparent from and can be derived from the description of the specification, the drawings, the claims, and the like.

One embodiment of the present invention is a light-emitting device including a first flexible substrate, a second flexible substrate, a first buffer layer, a first crack inhibiting layer, and a light-emitting element. A first surface of the first flexible substrate faces a second surface of the second flexible substrate. The first buffer layer and the first crack inhibiting layer are provided over the first surface of the first flexible substrate. The first buffer layer overlaps with the first crack inhibiting layer. The light-emitting element is provided over the second surface of the second flexible substrate.

In the above light-emitting device, it is preferable that the first buffer layer include an inorganic material, the light-emitting element include a light-emitting organic compound, and the first crack inhibiting layer include one of a conductive material and a resin material and be positioned between the light-emitting element and an end portion of the first flexible substrate when seen from a direction perpendicular to the first surface.

In the above light-emitting device, it is preferable that a first bonding layer be provided between the first flexible substrate and the first buffer layer, and a second bonding layer and a second buffer layer be provided between the second flexible substrate and the light-emitting element.

In the above light-emitting device, it is preferable that a layer be provided over the first surface of the first flexible substrate, and the layer serve as a marker and include the same material as the first crack inhibiting layer.

In the above light-emitting device, it is preferable that a light-blocking layer be provided over the first surface of the first flexible substrate, and the light-blocking layer have a function of blocking light from the light-emitting element and include the same material as the first crack inhibiting layer.

In the above light-emitting device, it is preferable that a cover layer be provided over the first surface of the first flexible substrate, the cover layer include a portion covering the first crack inhibiting layer, and the cover layer include a conductive material or a resin material and be positioned between the light-emitting element and an end portion of the first flexible substrate when seen from a direction perpendicular to the first surface.

In the above light-emitting device, it is preferable that a second crack inhibiting layer be provided over the second surface of the second flexible substrate, and the second crack inhibiting layer include a conductive material or a resin material and be positioned between the light-emitting element and an end portion of the first flexible substrate when seen from a direction perpendicular to the first surface.

Another embodiment of the present invention is a light-emitting module including a touch sensor over a third surface of the first flexible substrate or a fourth surface of the second flexible substrate in the light-emitting device with any of the above structures. The third surface is an opposite surface of the first flexible substrate, and the fourth surface is an opposite surface of the second flexible substrate.

Note that the light-emitting device in this specification includes, in its category, a display device using a light-emitting element. Furthermore, the light-emitting device may be included in a module in which a light-emitting element is provided with a connector such as an anisotropic conductive film or a tape carrier package (TCP), a module in which a printed wiring board is provided at the end of a TCP, and a module in which an integrated circuit (IC) is directly mounted on a light-emitting element by a chip on glass (COG) method. The light-emitting device may also be included in lighting equipment or the like.

According to one embodiment of the present invention, a flexible light-emitting device with fewer defects caused by a crack can be provided. Alternatively, a flexible light-emitting device with high productivity can be provided. A light-emitting device with high reliability can also be provided.

According to another embodiment of the present invention, a novel light-emitting device can be provided. Alternatively, a lightweight light-emitting device can be provided. A light-emitting device that is less likely to be broken can also be provided. Still alternatively, a thin light-emitting device can be provided. Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF DRAWINGS

In the accompanying drawings:
FIGS. 1A and 1B illustrate a structure example of a display device of one embodiment;
FIGS. 2A to 2D illustrate a structure example of a display device of one embodiment;
FIGS. 4A and 4B illustrate a method for manufacturing a display device of one embodiment;
FIGS. 5A and 5B illustrate a method for manufacturing a display device of one embodiment;
FIGS. 6A and 6B illustrate a method for manufacturing a display device of one embodiment;
FIGS. 11A and 11B illustrate a structure example of a display device of one embodiment;
FIG. 12 illustrates a structure example of a display device of one embodiment;
FIG. 21 illustrates a method for manufacturing a display device of one embodiment.

BEST MODE FOR CARRYING OUT THE INVENTION

Figure 3A:
FIGS. 3A to 3C illustrate a method for manufacturing a display device of one embodiment.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the present invention described below, the same portions or portions having similar functions are denoted by the same reference numerals in different drawings, and the description thereof is not repeated in some cases. Furthermore, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the invention are not limited to such scales.

Note that ordinal numbers such as "first" and "second" in this specification and the like are used in order to avoid confusion among components, and the terms do not limit the components numerically.

Embodiment 1

In this embodiment, an example of a structure and a manufacturing method of an image display device, which is an example of a light-emitting device of one embodiment of the present invention, will be described with reference to drawings. As an example of the image display device, an image display device (hereinafter, also referred to as display device) including an organic electroluminescence (EL) element will be described below.

Structure Example of Display Device

FIG. 1A is a schematic top view of a display device 100 with a top emission structure. Note that in FIG. 1A, some components are not illustrated for clarity.

FIG. 1B is a schematic cross-sectional view of FIG. 1A along line A1-B1 passing through a region including one of the four corners of the second substrate 101, along line C1-D1 passing through part of a display portion 102, and along line E1-F1 passing through a region including a signal line driver circuit 103 and an external connection terminal 105.

The display device 100 includes, over a top surface of the second substrate 101, the display portion 102, the signal line driver circuit 103, a scan line driver circuit 104, and the external connection terminal 105.

In the display device 100, a crack inhibiting region 110 is provided to surround the display portion 102. In addition, markers 124 are provided at the four corners of a first substrate 121.

Here, the crack inhibiting region 110 includes at least one crack inhibiting layer that will be described later.

In the display device 100, the first substrate 121 and the second substrate 101 face each other with a sealing layer 153 and a sealant 154 interposed therebetween. A first buffer layer (also referred to as a layer to be separated, and hereinafter simply referred to as a buffer layer) 120 is provided on the first substrate 121 with a bonding layer 125 interposed therebetween. The crack inhibiting region 110 including a plurality of first crack inhibiting layers (hereinafter simply referred to as crack inhibiting layers) 122, and the like are provided in contact with the buffer layer 120. Furthermore, a second buffer layer 132 is provided over the second substrate 101 with a bonding layer 131 interposed therebetween. A light-emitting element 114 functioning as a display element, transistors included in the display portion 102, the signal line driver circuit 103, the scan line driver circuit 104, and the like, and the external connection terminal 105 are provided over the second buffer layer 132.

Note that the first substrate 121 and the second substrate 101 are preferably flexible substrates.

The buffer layer 120 and the second buffer layer 132 inhibit diffusion of impurities that have passed through the substrates (the first substrate 121 and the second substrate 101) and the bonding layers (the bonding layers 125 and 131), to the light-emitting element 114 and the like. In particular, the buffer layer 120 over the light-emitting element 114 increases the reliability of the display device 100.

The buffer layer 120 serves as a barrier film preventing diffusion of impurities to the light-emitting element 114. The buffer layer 120 can be, for example, a single film or layered films of an inorganic material. The use of such a material increases the moisture-proof property of the display device even when the first substrate 121 is made of a material having a low barrier property, particularly a low moisture-proof property.

However, brittle fracture easily occurs in the inorganic film, which might cause a crack in the buffer layer 120 when, for example, the display device 100 is bent. In addition, the inorganic film with low moisture permeability has a low swelling ratio; therefore, in the case where, for example, the display device 100 is placed in a high temperature and high humidity environment, a layer in the vicinity of the buffer layer 120 swells more than the buffer layer 120. This leads to stress concentration at the interface between the buffer layer 120 and the adjacent layer, causing a crack in some cases.

Hence, the crack inhibiting layers 122, which are made of a material different from that of the inorganic film included in the buffer layer 120, are provided in contact with the buffer layer 120. As a result, the development of the crack generated in the buffer layer 120 can be hindered.

The crack inhibiting layers 122 are preferably formed using a conductive film that has higher ductility and a lower swelling ratio than the inorganic film.

Furthermore, the crack inhibiting layers 122 are preferably formed of a resin material that has high adhesion to the inorganic film, in which case stress concentration on the surface of the buffer layer 120 can be reduced at the interface between the crack inhibiting layers 122 and the buffer layer 120.

The crack inhibiting region 110 includes the two crack inhibiting layers 122. As illustrated in FIG. 1A, each of the crack inhibiting layers 122 is a closed curve (also referred to as a loop or a curve with the ends touching) when seen from above, by which the display portion 102 is surrounded.

By thus providing the crack inhibiting region 110 so as to surround the display portion 102, in the case where a plurality of display devices 100 are manufactured at a time over a large substrate and then divided into each, a crack generated in an end portion of the buffer layer 120 can be prevented from developing across the crack inhibiting region 110.

In addition, the display device 100 can be manufactured through the step of separating a support substrate as described later. In that case, a crack might be generated in the buffer layer 120 as the separation proceeds from an end portion of the substrate; however, the crack can be prevented from developing across the crack inhibiting region 110.

Note that the crack inhibiting region 110 is not necessarily provided to be a closed curve and may be divided into plural lines, though the crack inhibiting region 110 in FIG. 1A is a closed curve surrounding the display portion 102.

FIG. 2A is a schematic top view of the display device 100 in which the crack inhibiting region 110 includes, for example, the three crack inhibiting layers 122. FIG. 2B is an enlarged schematic top view of part (surrounded by a dashed line) of the crack inhibiting region 110 in FIG. 2A.

A crack tends to linearly develop from an end portion of the display device 100 to the inside as indicated by a dashed-dotted arrow in FIG. 2A. Therefore, instead of the structure in FIG. 2B in which the crack inhibiting layers 122 are closed curves, the crack inhibiting layers 122 preferably have a structure in which cut portions are provided in positions different from each other as illustrated in FIG. 2C, in which case the development of a crack can be hindered without increasing the stiffness of the display device 100. Furthermore, all the crack inhibiting layers 122 which have cut portions are not necessarily disposed perpendicularly to the direction where the crack develops; for example, the crack inhibiting layers 122 may be arranged as illustrated in FIG. 2D.

The markers 124 in contact with the buffer layer 120 serve as scribe markers in this structure example, though they may have a different function.

For example, the markers 124 may be alignment markers used for alignment in the deposition of an EL layer or bonding of support substrates described in the later example of a manufacturing method. In the case where a plurality of display devices 100 are manufactured at a time over a large substrate, the alignment markers may be arranged outside a line at which the display devices 100 are divided into each.

Other components of the display device 100 will be described below with reference to FIG. 1B.

The external connection terminal 105 is preferably formed using the same material as a conductive layer included in the transistors (transistors 111, 112, and 113) or the light-emitting element 114 of the display device 100, in which case the manufacturing process can be simplified. In this structure example, the external connection terminal 105 is formed using the same material as a first electrode 143 and an electrode 136 which forms a source or drain electrode of the transistor. A signal can be input to the display device 100 when a flexible printed circuit (FPC) or an IC is mounted on the external connection terminal 105 via an anisotropic conductive film (ACF), an anisotropic conductive paste (ACP), or the like. In this structure example, an FPC 155 is provided via a connector 156.

FIG. 1B illustrates an example where the signal line driver circuit 103 includes the transistor 111. The signal line driver circuit 103 may be, for example, a circuit in which an n-channel transistor and a p-channel transistor are used in combination, or a circuit that is formed of either n-channel transistors or p-channel transistors. The same applies to the scan line driver circuit 104. Furthermore, this structure example shows a structure in which the signal line driver circuit 103 and the scan line driver circuit 104 are formed over the second buffer layer 132 over which the display portion 102 is formed. Alternatively, for example, a driver circuit IC may be used as the signal line driver circuit 103, the scan line driver circuit 104, or both and the driver circuit IC may be mounted on the second substrate 101 by a chip on glass (COG) method or a chip on film (COF) method; alternatively, a flexible printed substrate (FPC) provided with the driver circuit IC by the COF method may be mounted on the second substrate 101.

FIG. 1B illustrates a cross-sectional structure of one pixel as an example of the display portion 102. The pixel includes the switching transistor 112, the current control transistor 113, and the first electrode 143 electrically connected to one of the pair of electrodes 136 of the current control transistor 113. An insulating layer 144 is provided to cover an end portion of the first electrode 143.

In this example, the transistors (111, 112, and 113) in the display device 100 are bottom-gate transistors. Each of the transistors includes a semiconductor layer 135 having a region serving as a channel, a gate electrode 133, and an insulating layer 134 serving as a gate insulating layer. Moreover, the pair of electrodes 136 are provided in contact with the semiconductor layer 135, and an insulating layer 141 and an insulating layer 142 are provided to cover the semiconductor layer 135 and the electrodes 136. Note that in the semiconductor layer 135, low-resistance regions may be provided with the region serving as a channel interposed therebetween.

The light-emitting element 114 has a layered structure in which the first electrode 143, an EL layer 151, and a second electrode 152 are stacked in this order over the insulating layer 142. Since the display device 100 shown in this structure example is a top emission display device, a light-transmitting material is used for the second electrode 152. A reflective material is preferably used for the first electrode 143. The EL layer 151 contains at least a light-emitting organic compound. When voltage is applied between the first electrode 143 and the second electrode 152 with the EL layer 151 interposed therebetween so that current flows in the EL layer 151, the light-emitting element 114 can emit light.

The first substrate 121 is provided to face the second substrate 101. The second substrate 101 and the first substrate 121 are bonded to each other with the sealing layer 153 and the sealant 154 that is provided outside the display portion 102 and on the inner side of the crack inhibiting region 110. Note that the sealant 154 is not necessarily provided and the first substrate 121 may be bonded only with the sealing layer 153.

The buffer layer 120 is provided on the surface of the first substrate 121, which faces the light-emitting element 114, with the bonding layer 125 interposed therebetween. A color filter 127 and a black matrix 126 are provided on the buffer layer 120 so as to overlap with the light-emitting element 114 and the insulating layer 144, respectively.

On the other surface of the first substrate 121, which does not face the light-emitting element 114, a transparent conductive film may be provided to form a touch sensor, or a flexible substrate having a function of a touch sensor may be attached.

[Material and Formation Method]

Materials and manufacturing methods of the aforementioned components will be described below.

[Flexible Substrate]

As the flexible substrate, an organic resin substrate, a glass substrate thin enough to have flexibility, or the like can be used.

Examples of the materials include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. It is particularly preferable to use a material with a low thermal expansion coefficient, for example, a material with a thermal expansion coefficient lower than or equal to $30 \times 10^{-6}$/K, such as a polyamide imide resin, a polyimide resin, or PET. It is also possible to use a substrate in which a fibrous body is impregnated with a resin (also referred to as prepreg) or a substrate whose thermal expansion coefficient is reduced by mixing an inorganic filler with an organic resin.

In the case where a fibrous body is included in the above material, a high-strength fiber of an organic compound or an inorganic compound is used as the fibrous body. The high-strength fiber is specifically a fiber with a high tensile modulus of elasticity or a fiber with a high Young's modulus. Typical examples include a polyvinyl alcohol-based fiber, a polyester-based fiber, a polyamide-based fiber, a polyethylene-based fiber, an aramid-based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven fabric or a nonwoven fabric, and a structure body in which this fibrous body is impregnated with a resin and the resin is cured may be used as a flexible substrate. The structure body including the fibrous body and the resin is preferably used as a flexible substrate, in which case the reliability against bending and damage due to local pressure can be increased.

A material capable of transmitting light emitted from the EL layer 151 is used for the flexible substrate through which light emitted from the light-emitting element 114 is transmitted. To improve the outcoupling efficiency of the material provided on the light extraction side, the refractive index of the flexible, light-transmitting material is preferably high. For example, a substrate obtained by dispersing an inorganic filler having a high refractive index into an organic resin can have a higher refractive index than the substrate formed of only the organic resin. In particular, an inorganic filler having a particle diameter as small as 40 nm or less is preferably used, in which case such a filler can maintain optical transparency.

The substrate provided on the side opposite to the side through which light is transmitted does not need to have a light-transmitting property; therefore, a metal substrate, an alloy substrate, or the like can be used as well as the above substrates. To obtain flexibility and bendability, the thickness of a substrate is preferably greater than or equal to 10 μm and less than or equal to 200 μm, more preferably greater than or equal to 20 μm and less than or equal to 50 μm. Although there is no particular limitation on a material of the substrate, it is preferable to use, for example, aluminum, copper, nickel, or a metal alloy such as an aluminum alloy or stainless steel. A conductive substrate containing a metal or an alloy material is preferably used as the flexible substrate provided on the side through which light is not transmitted, in which case the dissipation of heat generated from the light-emitting element 114 can be improved.

In the case where a conductive substrate is used, a surface of the substrate is preferably oxidized or provided with an insulating film so as to be insulated. For example, an insulating film may be formed over the surface of the conductive substrate by an electrodeposition method, a coating method such as a spin-coating method or a dip method, a printing method such as a screen printing method, or a deposition method such as an evaporation method or a sputtering method. Alternatively, the surface of the substrate may be oxidized by being exposed to an oxygen atmosphere or heated in an oxygen atmosphere or by an anodic oxidation method.

In the case where the flexible substrate has an uneven surface, a planarization layer may be provided to cover the uneven surface so that a flat insulating surface is formed. An insulating material can be used for the planarization layer; an organic material or an inorganic material can be used. The planarization layer can be formed by a deposition method such as a sputtering method, a coating method such as a spin-coating method or a dip method, a discharging method such as an ink jet method or a dispensing method, a printing method such as a screen printing method, or the like.

As the flexible substrate, a material including a plurality of stacked layers can also be used. For example, a material in which two or more kinds of layers formed of an organic resin are stacked, a material in which a layer formed of an organic resin and a layer formed of an inorganic material are stacked, or a material in which two or more kinds of layers formed of an inorganic material are stacked is used. With a layer formed of an inorganic material, moisture and the like are prevented from entering the inside, resulting in improved reliability of the display device.

As the inorganic material, an oxide material, a nitride material, or an oxynitride material of a metal or a semiconductor, or the like can be used. For example, silicon oxide, silicon nitride, silicon oxynitride, aluminum oxide, aluminum nitride, or aluminum oxynitride may be used. Note that in this specification, the nitride oxide refers to a material containing a larger amount of nitrogen than oxygen, and the oxynitride refers to a material containing a larger amount of oxygen than nitrogen. Note that the content of each element can be measured by, for example, Rutherford backscattering spectrometry (RBS).

For example, in the case where a layer formed of an organic resin and a layer formed of an inorganic material are stacked, the layer formed of an inorganic material can be formed over or under the layer formed of an organic resin by a sputtering method, a chemical vapor deposition (CVD) method, a coating method, or the like.

As the flexible substrate, a glass substrate thin enough to have flexibility may also be used. Specifically, it is preferable to use a sheet in which an organic resin layer, a bonding layer, and a glass layer are sequentially stacked from the side close to the light-emitting element 114. The thickness of the glass layer is greater than or equal to 20 μm and less than or equal to 200 μm, preferably greater than or equal to 25 μm and less than or equal to 100 μm. Such a thickness allows the glass layer to have both high flexibility and a high barrier property against water and oxygen. The thickness of the organic resin layer is greater than or equal to 10 μm and less than or equal to 200 μm, preferably greater than or equal to 20 μm and less than or equal to 50 μm. With such an organic resin layer in contact with the glass layer, breakage or a crack of the glass layer can be inhibited, resulting in increased mechanical strength. Forming the flexible substrate by using such a composite material of a glass material and an organic resin makes it possible to obtain a flexible display device with extremely high reliability.

Alternatively, a substrate which does not have flexibility, such as a glass substrate, may be used.

[Light-Emitting Element]

As the light-emitting element, a self-luminous element can be used, and an element whose luminance is controlled by current or voltage is included in the category of the light-emitting element. For example, a light-emitting diode (LED), an organic EL element, or an inorganic EL element can be used.

The light-emitting element 114 included in the display device 100 of this embodiment includes a pair of electrodes (the first electrode 143 and the second electrode 152), and the EL layer 151 between the pair of electrodes. One of the pair of electrodes functions as an anode and the other functions as a cathode.

In the light-emitting element 114, a material transmitting light emitted from the EL layer 151 is used for the electrode on the light emission side.

As the light-transmitting material, indium oxide, indium oxide-tin oxide, indium oxide-zinc oxide, zinc oxide, and zinc oxide to which gallium is added can be used. Graphene may also be used. Other examples are a metal material such as gold, silver, platinum, magnesium, nickel, tungsten, chromium, molybdenum, iron, cobalt, copper, palladium, and titanium; and an alloy material containing any of these metal materials. A nitride of the metal material (e.g., titanium nitride) or the like may also be used. In the case of using the metal material (or the nitride thereof), the thickness is set small enough to be able to transmit light. Alternatively, a stack including any of the above materials can also be used as the conductive layer. For example, a layered film of a silver-magnesium alloy and indium oxide-tin oxide is preferably used, in which case electrical conductivity can be increased.

Such an electrode is formed by an evaporation method, a sputtering method, or the like. A discharging method such as an ink jet method, a printing method such as a screen printing method, or a plating method may also be used.

Note that when the above conductive oxide having a light-transmitting property is formed by a sputtering method, the deposition under an atmosphere containing argon and oxygen increases the light-transmitting property.

Further, in the case where the conductive oxide film is formed over the EL layer, the conductive oxide film is preferably a layered film of a first conductive oxide film formed under an argon-containing atmosphere with a reduced oxygen concentration and a second conductive oxide film formed under an atmosphere containing argon and oxygen, in which case deposition damage to the EL layer can be reduced. Here, the purity of an argon gas used for formation of the first conductive oxide film is preferably high, and for example, it is preferable to use the argon gas whose dew point is lower than or equal to −70° C., more preferably lower than or equal to −100° C.

A material capable of reflecting light emitted from the EL layer 151 is preferably used for the electrode provided on the side opposite to the side through which light is transmitted.

As the light-reflecting material, for example, a metal such as aluminum, gold, platinum, silver, nickel, tungsten, chromium, molybdenum, iron, cobalt, copper, or palladium or an alloy containing any of these metals can be used. Alternatively, lanthanum, neodymium, germanium, or the like may be added to a metal or an alloy containing any of these metal materials. In addition, any of the following can be used: alloys containing aluminum (aluminum alloys) such as an aluminum-titanium alloy, an aluminum-nickel alloy, and an aluminum-neodymium alloy; and alloys containing silver such as a silver-copper alloy, a silver-palladium-copper alloy, and a silver-magnesium alloy. The silver-copper alloy is preferable because of its high heat resistance. Furthermore, by stacking a metal film or a metal oxide film in contact with an aluminum alloy film, oxidation of the aluminum alloy film can be suppressed. Examples of a material for the metal film or the metal oxide film are titanium and titanium oxide. Further alternatively, a film containing any of the above light-transmitting materials and a film containing any of the above metal materials may be stacked. For example, a layered film including silver and indium oxide-tin oxide, or a layered film including a silver-magnesium alloy and indium oxide-tin oxide can be used.

Such an electrode is formed by an evaporation method, a sputtering method, or the like. A discharging method such as an ink jet method, a printing method such as a screen printing method, or a plating method may also be used.

The EL layer 151 includes at least a layer containing a light-emitting organic compound (hereinafter also referred to as a light-emitting layer), and may be either a single layer or a plurality of stacked layers. As an example of the structure including a plurality of stacked layers, a hole-injection layer, a hole-transport layer, a light-emitting layer, an electron-transport layer, and an electron-injection layer can be stacked in this order from an anode side. Note that not all of these layers except the light-emitting layer are necessarily provided in the EL layer 151. Furthermore, each of these layers may be provided in duplicate or more. Specifically, in the EL layer 151, a plurality of light-emitting layers may be provided or another hole-injection layer may be provided over the electron-injection layer. Furthermore, another component such as a charge-generation layer or an electron-relay layer may be added as appropriate as an intermediate layer. Alternatively, a plurality of light-emitting layers exhibiting different colors may be stacked. For example, a white emission can be obtained by stacking two or more layers emitting light of complementary colors.

The EL layer 151 can be formed by a vacuum evaporation method, a discharging method such as an ink jet method or a dispensing method, or a coating method such as a spin-coating method.

[Sealant, Sealing Layer, and Bonding Layer]

As the sealant 154 and the sealing layer 153, it is possible to use, for example, a gel or a curable material such as a two-component-mixture type resin, a thermosetting resin, or a light curable resin. For example, an epoxy resin, an acrylic resin, a silicone resin, a phenol resin, polyimide, polyvinyl chloride (PVC), polyvinyl butyral (PVB), or ethylene vinyl acetate (EVA) can be used. In particular, a material with low moisture permeability, such as an epoxy resin, is preferable.

A drying agent may be contained in the sealant 154 and/or the sealing layer 153. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used as the drying agent. In the case where a granular drying agent is used, light emitted from the light-emitting element 114 is diffusely reflected by the drying agent; thus, a highly reliable light-emitting device (particularly useful for lighting and the like) with improved viewing angle dependence can be achieved. Note that as the bonding layers 125 and 131, the same material as the sealant 154 may be used.

[Transistor]

There is no particular limitation on the structures of transistors in the display portion 102, the signal line driver circuit 103, and the scan line driver circuit 104. For example, a forward staggered transistor or an inverted staggered transistor may be used. Furthermore, either a top-gate transistor or a bottom-gate transistor may be used. In addition, either a channel-etched transistor or a channel protective transistor may be used. In the case of a channel protective transistor, a channel protective film may be provided only over a channel region. Alternatively, an opening may be formed only in a portion where a source electrode and a drain electrode are in contact with a semiconductor layer and a channel protective film may be provided in an area other than the opening.

As a semiconductor applicable to a semiconductor layer in which a channel of a transistor is formed, for example, a semiconductor material such as silicon or germanium, a compound semiconductor material, an organic semiconductor material, or an oxide semiconductor material may be used.

There is no particular limitation on the crystallinity of a semiconductor used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of transistor characteristics can be reduced.

In the case where, for example, silicon is used as the semiconductor, amorphous silicon, microcrystalline silicon, polycrystalline silicon, single crystal silicon, or the like can be used.

In the case where an oxide semiconductor is used as the semiconductor, an oxide semiconductor containing at least one of indium, gallium, and zinc is preferably used. Typically, an In—Ga—Zn-based metal oxide can be used. An oxide semiconductor having a wider band gap and a lower carrier density than silicon is preferably used, in which case off-state leakage current can be reduced.

In this structure example, a bottom-gate transistor is used; the case of using a top-gate transistor will be described in a later embodiment.

[Buffer Layer and Insulating Layer]

The buffer layer 120 has a function of inhibiting diffusion of impurities, particularly moisture, which have passed through the first substrate 121 and the bonding layer 125. The second buffer layer 132 has a function of inhibiting diffusion of impurities that have passed through the second substrate 101 and the bonding layer 131. The insulating layer 134 in contact with the semiconductor layer of the transistor and the insulating layer 141 covering the transistor preferably prevent impurities from diffusing into the semiconductor layer. These layers can be formed using, for example, oxide or nitride of a semiconductor such as silicon or oxide or nitride of a metal such as aluminum. Alternatively, a layered film of such an inorganic insulating material or a layered film of such an inorganic insulating material and an organic insulating material may be used.

As the inorganic insulating material, for example, a single layer of or a stack including one or more materials selected from aluminum nitride, aluminum oxide, aluminum nitride oxide, aluminum oxynitride, magnesium oxide, gallium oxide, silicon nitride, silicon oxide, silicon nitride oxide, silicon oxynitride, germanium oxide, zirconium oxide, lanthanum oxide, neodymium oxide, and tantalum oxide.

As the inorganic insulating material, a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide may be used.

The insulating layer 142 functions as a planarization layer covering steps formed due to a transistor, a wiring, or the like. For the insulating layer 142, for example, an organic resin such as polyimide, acrylic, polyamide, or epoxy or an inorganic insulating material can be used. It is preferable to use a photosensitive resin (e.g., acrylic or polyimide) for the insulating layer 142. The insulating layer 144 can be formed using the same material as the insulating layer 142.

[Crack Inhibiting Layer and Marker]

The crack inhibiting layer 122 and the marker 124 can be formed using a conductive material; furthermore, they are preferably formed using the same material to simplify the process.

The crack inhibiting layer 122 is preferably formed of a conductive material that is highly resistant to external stress so as to hinder the development of a crack in the buffer layer 120 in contact with the crack inhibiting layer 122.

The marker 124 is used to mark the position to be cut in the case where, for example, a plurality of display devices 100 are manufactured at a time over a large substrate and divided into each, i.e., by a multiple panel method. Hence, the marker 124 is preferably formed of a conductive material because in the case where the substrate is divided by a cutting apparatus, a clear edge of a pattern reduces the misalignment of a position to be read in the cutting apparatus.

Each of the clack inhibiting layer 122 and the marker 124 can be formed to have a single-layer structure or a layered structure using any of metal materials such as molybdenum, titanium, chromium, tantalum, tungsten, aluminum, copper, neodymium, and scandium, and an alloy material containing any of these elements. Alternatively, the clack inhibiting layer 122 and the marker 124 may each be formed using a conductive metal oxide.

The crack inhibiting layer 122 needs to have a thickness that allows the mechanical strength to be maintained. Specifically, the crack inhibiting layer 122 is formed as a conductive layer with a thickness of 50 nm to 1000 nm, preferably 100 nm to 500 nm.

In addition, the crack inhibiting layer 122 needs to have a width that allows the development of a crack to be hindered. However, an increase in the width of the crack inhibiting layer 122 might reduce the number of display devices that can be obtained from a substrate in the case where the display device 100 is manufactured by a multiple panel method or the like. Specifically, the crack inhibiting layer 122 is formed as a conductive layer with a width of 20 μm to 1000 μm, preferably 50 μm to 500 μm.

[Connector]

For the connector 156, it is possible to use a paste-like or sheet-like material that is obtained by mixing metal particles into a thermosetting resin and for which anisotropic electric conductivity is provided by thermocompression bonding. As the metal particles, particles in which two or more kinds of metals are layered, for example, nickel particles coated with gold are preferably used.

[Color Filter and Black Matrix]

The color filter 127 is provided in order to adjust the color of light emitted from the light-emitting element 114 to increase the color purity. For example, in a full-color display device using white light-emitting elements, a plurality of pixels provided with color filters of different colors are used. In that case, the color filters may be those of three colors of red (R), green (G), and blue (B) or four colors (yellow (Y) in addition to these three colors). Furthermore, a white (W) pixel may be added to R, G, and B pixels (and a Y pixel), that is, pixels of four colors (or five colors) may be used.

The black matrix 126 is provided between the adjacent color filters 127. The black matrix 126 shields a pixel from light emitted from the light-emitting element 114 in an adjacent pixel, thereby preventing color mixture between the adjacent pixels. When the color filter 127 is provided so that its end portion overlaps with the black matrix 126, light leakage can be reduced. The black matrix 126 can be formed using a material that blocks light emitted from the light-emitting element 114, for example, a metal material or an organic resin containing a pigment. Note that the black matrix 126 may be provided in a region other than the display portion 102, for example, in the signal line driver circuit 103.

An overcoat may be formed to cover the color filter 127 and the black matrix 126. The overcoat protects the color filter 127 and the black matrix 126 and suppresses the diffusion of impurities included in the color filter 127 and the black matrix 126. The overcoat is formed using a material that transmits light emitted from the light-emitting element 114, and can be formed using an inorganic insulating film or an organic insulating film.

Although this structure example shows the top emission display device, the display device may have a bottom emission structure. In that case, the color filter 127 is provided closer to the second substrate 101 than the light-emitting element 114 is. For example, the color filter may be provided over the insulating layer 141. The black matrix 126 may be provided to overlap with the transistor and the like.

Described in this structure example is a structure provided with a color filter, but a structure without a color filter may be employed, in which case each pixel includes any one of light-emitting elements exhibiting light of different colors (e.g., R, G, and B).

The above is the description of the components.

Example of Manufacturing Method

An example of a method for manufacturing the display device 100 will be described below with reference to drawings.

FIGS. 3A to 3C, FIGS. 4A and 4B, FIGS. 5A and 5B, and FIGS. 6A and 6B are schematic cross-sectional views each illustrating a stage in the method for manufacturing the display device 100 described below. FIGS. 3A to 3C, FIGS. 4A and 4B, FIGS. 5A and 5B, and FIGS. 6A and 6B illustrate cross-sectional structures of the components in FIGS. 1A and 1B.

[Formation of Separation Layer]

First, a separation layer 162 is formed over a support substrate 161.

A substrate having resistance high enough to withstand at least heat in a later step is used as the support substrate 161. Examples of the support substrate 161 include a glass substrate, a resin substrate, a semiconductor substrate, a metal substrate, and a ceramic substrate.

Note that it is preferable to use a large glass substrate as the support substrate 161 to increase productivity. For example, a glass substrate having any of the following sizes or a larger size can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

A high-melting-point metal material such as tungsten, titanium, or molybdenum can be used for the separation layer 162. Tungsten is preferably used.

The separation layer 162 can be formed by, for example, a sputtering method.

[Formation of Buffer Layer]

Then, the buffer layer 120 is formed over the separation layer 162 (FIG. 3A).

For the buffer layer 120, an inorganic insulating material such as silicon oxide, silicon oxynitride, silicon nitride oxide, silicon nitride, or aluminum oxide can be used. The buffer layer 120 can be a single layer or stacked layers containing any of these inorganic insulating materials.

The buffer layer 120 serves as a barrier film preventing entry of impurities from the outside of the support substrate 161. The buffer layer 120 also has a function of releasing hydrogen to the separation layer 162 by heating as described later. Therefore, it is particularly preferable that the buffer layer 120 include two or more stacked layers, at least one of which releases hydrogen when heated, and another of which, a layer further from the separation layer 162 than the layer releasing hydrogen is, does not transmit impurities. For example, the buffer layer 120 has a structure in which a layer containing silicon oxynitride and a layer containing silicon nitride are stacked in this order from the separation layer 162.

The buffer layer 120 can be formed by a film formation method such as a sputtering method or a plasma CVD method. In particular, the buffer layer 120 is preferably formed by a plasma CVD method using a deposition gas containing hydrogen.

A surface of the separation layer 162 is oxidized when the buffer layer 120 is formed, and as a result, an oxide (not shown) is formed between the separation layer 162 and the buffer layer 120. The oxide is a layer containing an oxide of the metal included in the separation layer 162. The oxide layer preferably contains tungsten oxide.

Tungsten oxide is generally represented by $WO_{(3-x)}$ and is a non-stoichiometric compound which can have a variety of compositions, typically $WO_3$, $W_2O_5$, $W_4O_{11}$, and $WO_2$. Titanium oxide $TiO_{(2-x)}$ and molybdenum oxide $MoO_{(3-x)}$ are also non-stoichiometric compounds.

The oxide layer at this stage preferably contains a large amount of oxygen. For example, in the case where tungsten is used for the separation layer 162, the oxide layer is preferably a tungsten oxide layer containing $WO_3$ as its main component.

The oxide layer can also be formed over the surface of separation layer 162 in advance by performing plasma treatment on the surface of the separation layer 162 in an atmosphere containing an oxidized gas (preferably a dinitrogen monoxide gas) before the formation of the buffer layer 120. When such a method is employed, the thickness of the oxide layer can vary depending on the conditions for the plasma treatment, and the thickness of the oxide layer can be controlled more effectively than in the case where plasma treatment is not performed.

The thickness of the oxide layer is, for example, greater than or equal to 0.1 nm and less than or equal to 100 nm, preferably greater than or equal to 0.5 nm and less than or equal to 20 nm. Note that the oxide layer with an extremely small thickness cannot be observed in a cross-sectional image in some cases.

[Heat Treatment]

Next, heat treatment is performed to change the quality of the oxide layer. By the heat treatment, hydrogen is released from the buffer layer 120 to the oxide layer.

The metal oxide in the oxide layer is reduced by hydrogen supplied to the oxide layer, so that a plurality of regions with different proportions of oxygen are mixed in the oxide layer. For example, in the case where tungsten is used for the separation layer 162, $WO_3$ in the oxide layer is reduced to generate an oxide with a proportion of oxygen lower than that of $WO_3$ (e.g., $WO_2$), resulting in a state where $WO_3$ and the oxide with the lower proportion of oxygen are mixed. The crystal structure of such a metal oxide depends on the proportion of oxygen; thus, when a plurality of regions with different proportions of oxygen are provided in the oxide layer, the mechanical strength of the oxide layer is reduced. As a result, the oxide layer is likely to be damaged inside, which facilitates a later separation step.

The heat treatment may be performed at a temperature higher than or equal to the temperature at which hydrogen is released from the buffer layer 120 and lower than or equal to the temperature at which the support substrate 161 is softened. Furthermore, the heat treatment is preferably performed at a temperature higher than or equal to the temperature at which a reduction reaction between hydrogen and the metal oxide in the oxide layer occurs. For example, in the case where tungsten is used for the separation layer 162, the heating temperature is higher than or equal to 420° C., higher than or equal to 450° C., higher than or equal to 600° C., or higher than or equal to 650° C.

As the temperature of the heat treatment increases, a larger amount of hydrogen can be released from the buffer layer 120, which facilitates a later separation step. However, even when the heating temperature is reduced in consideration of the heat resistance of the support substrate 161 and the productivity, separation can be performed effectively by performing plasma treatment on the separation layer 162 to form the oxide layer in advance as described above.

[Formation of Crack Inhibiting Layer and Marker]

Figure 3B:
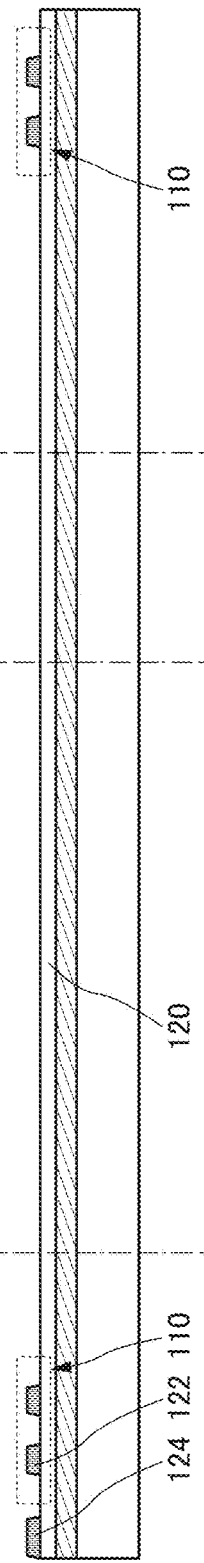

After that, a conductive film is formed over the buffer layer 120. A resist mask is then formed over the conductive film by a photolithography method or the like, and unnecessary portions of the conductive film are etched. Then, the resist mask is removed, so that the marker 124 and the crack inhibiting region 110 including a plurality of crack inhibiting layers 122 are formed (FIG. 3B).

Note that the aforementioned heat treatment may be performed after the formation of the crack inhibiting layers 122 and the marker 124. Such a process prevents the conductive film over the buffer layer 120 from being lifted after the formation.

When the heat treatment is performed on exposed surfaces of the crack inhibiting layers 122 and the marker 124, the surfaces are damaged by oxidation or the like in some cases. Therefore, part of the buffer layer 120 may be formed over the crack inhibiting layers 122 and the marker 124 (see FIG. 21). In FIG. 21, films included in a stack of a buffer layer 120a and a buffer layer 120b are preferably the same as the films included in the buffer layer 120. With such a structure, damage to the surfaces of the crack inhibiting layers 122 and the marker 124 can be inhibited without changing the transmittance of the entire buffer layer.

For example, the buffer layer 120a is a stack of a silicon oxynitride film with a thickness of approximately 600 nm, a silicon nitride film with a thickness of approximately 200 nm, a silicon oxynitride film with a thickness of approximately 200 nm, and a silicon nitride oxide film with a thickness of approximately 140 nm; and the buffer layer 120b is a silicon oxynitride film with a thickness of approximately 100 nm. Alternatively, the buffer layer 120a is a stack of a silicon oxynitride film with a thickness of approximately 600 nm, a silicon nitride film with a thickness of approximately 280 nm, a silicon oxynitride film with a thickness of approximately 180 nm, a silicon nitride oxide film with a thickness of approximately 140 nm, and a silicon oxynitride film with a thickness of approximately 115 nm; and the buffer layer 120b is a silicon oxynitride film with a thickness of approximately 100 nm.

[Formation of Black Matrix and Color Filter]

Figure 3C:
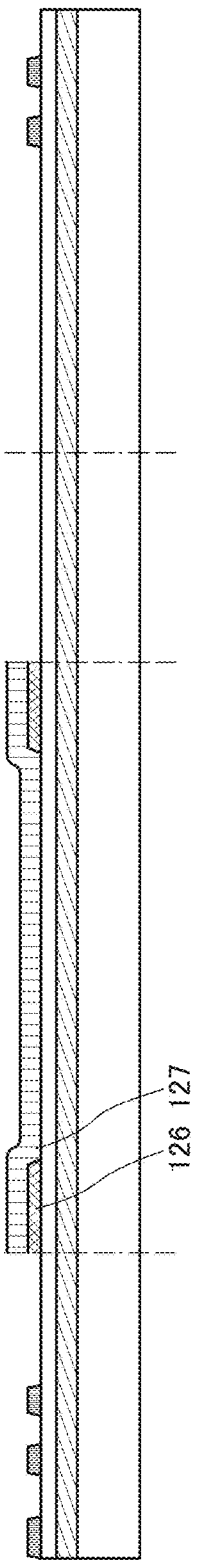

Subsequently, the black matrix 126 and the color filter 127 are formed over the buffer layer 120 (FIG. 3C). The black matrix 126 and the color filter 127 are formed by a printing method, an ink jet method, a photolithography method, or the like.

[Formation of Gate Electrode]

Next, a support substrate 163 provided with the separation layer 164 and the second buffer layer 132 is prepared. The separation layer 164 and the second buffer layer 132 are formed in a manner similar to that of the separation layer 162 and the buffer layer 120.

After that, a conductive film is formed over the second buffer layer 132. A resist mask is then formed over the conductive film by a photolithography method or the like, and unnecessary portions of the conductive film are etched. Then, the resist mask is removed, so that the gate electrode 133 is formed.

At this time, wirings and the like which form a circuit may be formed simultaneously.

The conductive film to be the gate electrode 133 is formed by a sputtering method, an evaporation method, a CVD method, or the like.

[Formation of Gate Insulating Layer]

Then, the insulating layer 134 is formed to cover the gate electrode 133.

The insulating layer 134 can be formed by a plasma CVD method, a sputtering method, or the like.

[Formation of Semiconductor Layer]

After that, a semiconductor film is formed over the insulating layer 134. A resist mask is then formed over the semiconductor film by a photolithography method or the like, and unnecessary portions of the semiconductor film are etched. Then, the resist mask is removed, so that the semiconductor layer 135 included in a transistor is formed.

The semiconductor film is formed by an appropriate method depending on a material. For example, a sputtering method, a CVD method, an MBE method, an atomic layer deposition (ALD) method, or a pulsed laser deposition (PLD) method can be used.

An oxide semiconductor is preferably used as a semiconductor in the semiconductor layer. In particular, an oxide semiconductor having a wider band gap than silicon is preferably used. A semiconductor material having a wider band gap and a lower carrier density than silicon is preferably used because the off-state current of the transistor can be reduced.

The oxide semiconductor preferably contains, for example, at least indium (In) or zinc (Zn). The oxide semiconductor further preferably contains an In-M-Zn-based oxide (M is a metal such as Al, Ti, Ga, Ge, Y, Zr, Sn, La, Ce, or Hf).

As the semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

There is no grain boundary in such an oxide semiconductor; therefore, generation of a crack in an oxide semiconductor film that is caused by stress when a display panel is bent is prevented. Such an oxide semiconductor can thus be preferably used for a flexible display panel that is used in a bent state, or the like.

In the case where polycrystalline silicon is used for the semiconductor film, a film of amorphous silicon is deposited and subjected to crystallization (e.g., laser light irradiation or heat treatment) to form a semiconductor film including polycrystalline silicon.

[Source Electrode and Drain Electrode]

After that, a conductive film is formed over the insulating layer 134 and the semiconductor layer 135. A resist mask is then formed over the conductive film by a photolithography method or the like, and unnecessary portions of the conductive film are etched. Then, the resist mask is removed, so that the electrodes 136 serving as a source and a drain electrode of the transistor are formed (FIG. 4A).

At this time, wirings and the like which form a circuit may be formed simultaneously.

The conductive film is formed by a sputtering method, an evaporation method, a CVD method, or the like.

At this stage, the transistors 111, 112, and 113 are obtained.

[Formation of Insulating Layer]

Subsequently, the insulating layer 141 that covers the insulating layer 134, the semiconductor layer 135, and the electrode 136 is formed. At this time, an opening reaching one of the electrodes 136 of the current control transistor 113 and a wiring to be the external connection terminal 105 is formed in the insulating layer 141.

The insulating layer 141 can be formed by a plasma CVD method, a sputtering method, or the like.

Note that this manufacturing method shows an example in which the insulating layer 141 over the semiconductor layer 135 is a single layer, but the insulating layer 141 may include two or more stacked layers.

[Formation of Planarization Layer]

Then, the insulating layer 142 serving as a planarization layer is formed. At this time, an opening reaching one of the electrodes 136 of the current control transistor 113 and a wiring to be the external connection terminal 105 is formed in the insulating layer 142.

For example, the insulating layer 142 is preferably formed in such a manner that a photosensitive organic resin is applied by a spin coating method or the like, and then is subjected to selective light exposure and development. As another formation method, a sputtering method, an evaporation method, a droplet discharging method (e.g., an inkjet method), a screen printing method, an offset printing method, or the like may be used.

[Formation of First Electrode]

After that, a conductive film is formed over the insulating layer 142. A resist mask is then formed over the conductive film by a photolithography method or the like, and unnecessary portions of the conductive film are etched. Then, the resist mask is removed, so that the first electrode 143 electrically connected to one of the electrodes 136 of the transistor 113 is formed.

At this time, wirings and the like which form a circuit may be formed simultaneously. In this example of manufacturing method, a wiring is formed over the same conductive film as the electrode 136 in a portion serving as the external connection terminal, so that the external connection terminal 105 is formed.

The conductive film is formed by a sputtering method, an evaporation method, a CVD method, or the like.

[Formation of Insulating Layer]

Then, the insulating layer 144 is formed to cover an end portion of the first electrode 143. At this time, an opening reaching the wiring serving as the external connection terminal 105 is formed in the insulating layer 144.

For example, the insulating layer 144 is preferably formed in such a manner that a photosensitive organic resin is applied by a spin coating method or the like, and then is subjected to selective light exposure and development. As another formation method, a sputtering method, an evaporation method, a droplet discharging method (e.g., an inkjet method), a screen printing method, an offset printing method, or the like may be used.

Note that an insulating layer may be provided over the insulating layer 144. In FIGS. 1A and 1B, the insulating layer over the insulating layer 144 in the display portion 102 adjusts the distance between the first substrate 121 and the second substrate 101. The insulating layer can be formed using the same material as the insulating layer 144.

[Formation of Light-Emitting Element]

The EL layer 151 and the second electrode 152 are sequentially formed over the first electrode 143; thus the light-emitting element 114 is obtained (FIG. 4B).

The EL layer 151 can be formed by a vacuum evaporation method, a discharging method such as an ink jet method or a dispensing method, or a coating method such as a spin-coating method. The second electrode 152 is formed by an evaporation method, a sputtering method, or the like.

[Bonding]

Then, over a surface of the support substrate 161 that is provided with the color filter 127 and the like, or over a surface of the support substrate 163 that is provided with the light-emitting element 114, the sealant 154 is formed to surround the display portion 102.

The sealant 154 is formed in such a manner that a curable resin is applied by, for example, a discharging method such as a dispensing method or a printing method such as a screen printing method, and a solvent in the resin is vaporized.

Then, the sealing layer 153 is formed over the support substrate 161 or the support substrate 163. The sealing layer 153 can be formed in a manner similar to that of the sealant 154.

The sealant 154 is provided so that the sealing with the sealing layer 153 is performed better. The sealant 154 is not necessarily provided if the sealing is performed adequately by the sealing layer 153.

Subsequently, the support substrate 161 and the support substrate 163 are bonded and the sealant 154 and the sealing layer 153 are cured, whereby the support substrate 161 and the support substrate 163 are attached to each other (FIG. 5A).

[Separation]

Then, the support substrate 161 is separated (FIG. 5B), and the exposed buffer layer 120 is bonded to the first substrate 121 with the bonding layer 125 therebetween. Furthermore, the support substrate 163 is separated, and the exposed second buffer layer 132 is bonded to the second substrate 101 with the bonding layer 131 therebetween (FIG. 6A). FIG. 6A shows a structure in which the first substrate 121 overlaps with the external connection terminal 105; however, the first substrate 121 does not necessarily overlap with the external connection terminal 105.

For the separation, for example, the support substrate 163 is fixed to a suction stage and a separation starting point is formed between the separation layer 162 and the buffer layer 120. The separation starting point may be formed by, for example, inserting a sharp instrument such as a knife between the layers. Alternatively, the separation starting point may be formed by irradiating a region of the separation layer 162 with laser light to melt, evaporate, or thermally break the region. Further alternatively, the separation starting point may be formed by dripping liquid (e.g., alcohol, water, or water containing carbon dioxide) onto an end portion of the separation layer 162 so that the liquid penetrates into an interface between the separation layer 162 and the buffer layer 120 by using capillary action.

Then, physical force is gently applied to the area where the separation starting point is formed in a direction substantially perpendicular to the bonded surfaces, so that separation can be performed without damage to the buffer layer 120 and layers provided thereover.

It is preferable that a separation starting point be formed in an end portion of the support substrate 161 so that the separation proceeds from the end portion. In the formation of the separation starting point, a crack occurs in some cases in the buffer layer 120 near the end portion of the support substrate 161. The crack formed at this time might develop from the outer side to the inner side of the buffer layer 120 as the separation proceeds. However, even when such a crack occurs, development of the crack can be stopped in a region where the crack inhibiting region 110 is provided because the display portion 102 is surrounded by the crack inhibiting region 110; thus, the crack can be effectively prevented from reaching the display portion 102.

A method for separating the support substrate 163 will be described next. For example, another support substrate is bonded to the first substrate 121 with a removable bonding layer (e.g., a water-soluble adhesive or a low-viscosity adhesive) therebetween. Then, a separation starting point may be formed between the separation layer 164 and the second buffer layer 132 while the other support substrate is fixed similarly to the above. Alternatively, the first substrate 121 is fixed to a suction pad while the support substrate 163 is fixed; then, a separation starting point is formed between the separation layer 164 and the second buffer layer 132. After that, the suction pad is gently raised up so that the first substrate 121 and the like are not bent.

Lastly, an opening is formed in the first substrate 121, the bonding layer 125, the buffer layer 120, and the sealing layer 153, whereby the external connection terminal 105 is exposed (FIG. 6B). Note that in the case where the first substrate 121 does not overlap with the external connection terminal 105, an opening is formed in the buffer layer 120 and the sealing layer 153. There is no particular limitation on the method for forming the opening; for example, a laser ablation method, an etching method, or an ion beam sputtering method can be employed. As another method, a cut may be made in a film over the external connection terminal 105 with a sharp knife or the like and part of the film may be separated by physical force. In that case, an opening can be formed without damage to the external connection terminal 105 when a film with a low adhesion to a conductive film such as an EL layer is provided over the electrode 143, which is the outermost surface of the external connection terminal 105.

Through the above process, the display device 100 can be manufactured.

Note that any of a variety of methods can be used as appropriate for the aforementioned separation process. For example, when a layer including a metal oxide film is formed as the separation layer on the side in contact with the buffer layer, the metal oxide film is embrittled by crystallization, whereby the buffer layer can be separated from the support substrate. Alternatively, when an amorphous silicon film containing hydrogen is formed as the separation layer between a support substrate having high heat resistance and a buffer layer, the amorphous silicon film is removed by laser light irradiation or etching, whereby the buffer layer can be separated from the support substrate. Alternatively, after a layer including a metal oxide film is formed as the separation layer on the side in contact with the buffer layer, the metal oxide film is embrittled by crystallization, and part of the separation layer is removed by etching using a solution or a fluoride gas such as $NF_3$, $BrF_3$, or $ClF_3$, whereby the separation can be performed at the embrittled metal oxide film. Further alternatively, the following method may be employed: a film containing nitrogen, oxygen, hydrogen, or the like (e.g., an amorphous silicon film containing hydrogen, an alloy film containing hydrogen, or an alloy film containing oxygen) is used as the separation layer, and the separation layer is irradiated with laser light to release the nitrogen, oxygen, or hydrogen contained in the separation layer as gas, thereby promoting separation between the buffer layer and the support substrate. Alternatively, it is possible to use a method in which the support substrate provided with the buffer layer is removed mechanically or by etching using a solution or a fluoride gas such as $NF_3$, $BrF_3$, or $ClF_3$. In this case, the separation layer is not necessarily provided.

When a plurality of the above-described separation methods are combined, the separation process can be conducted easily. In other words, separation can be performed with physical force (by a machine or the like) after performing laser light irradiation, etching on the separation layer with a gas, a solution, or the like, or mechanical removal with a sharp knife, scalpel or the like so that the separation layer and the buffer layer can be easily separated from each other.

Separation of the buffer layer from the support substrate may be performed by soaking the interface between the separation layer and the buffer layer in a liquid. Furthermore, the separation may be performed while a liquid such as water is being poured.

As another separation method, in the case where the separation layer is formed using tungsten, it is preferable that the separation be performed while etching the separation layer using a mixed solution of ammonium water and a hydrogen peroxide solution.

Note that the separation layer is not necessarily provided in the case where separation at the interface between the support substrate and the buffer layer is possible.

Figure 7:
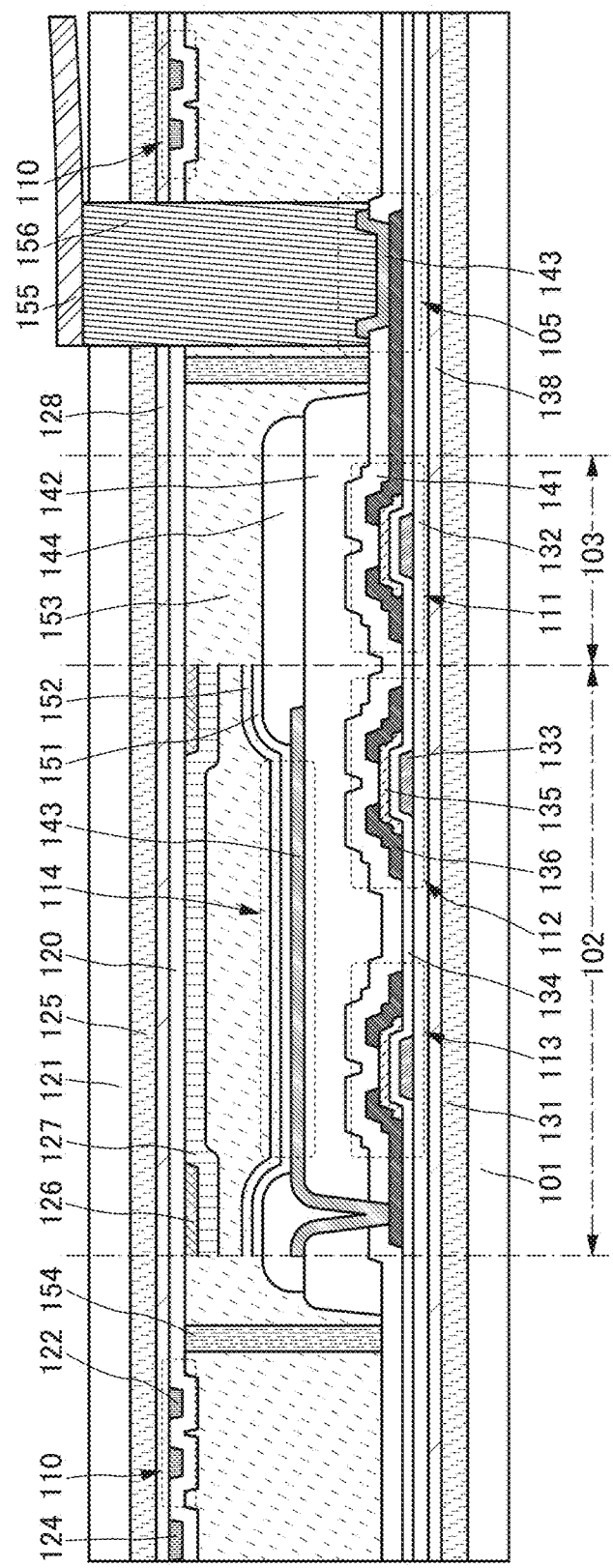
FIG. 7 illustrates a structure example of a display device of one embodiment.

For example, glass is used as the support substrate, an organic resin such as polyimide is formed in contact with the glass, and an insulating film, a transistor, and the like are formed over the organic resin. In this case, heating the organic resin enables the separation at the interface between the support substrate and the organic resin. FIG. 7 is a schematic cross-sectional view of the display device 100 manufactured by separation at the interface between the support substrate and the organic resin. An organic resin layer 128 is provided on the surface of the first substrate 121 that faces the light-emitting element 114, with the bonding layer 125 therebetween, and an organic resin layer 138 is provided over the second substrate 101 with the bonding layer 131 therebetween. In addition, the crack inhibiting region 110 and the marker 124, and the buffer layer 120 are provided in this order in contact with the organic resin layer 128. The second buffer layer 132 is provided over the organic resin layer 138. The other parts of the structure are similar to those in FIG. 1B. With such a structure, even when a crack is generated in an end portion of the buffer layer 120 as the separation is caused at the interface between the support substrate and the organic resin, the crack can be prevented from developing across the crack inhibiting region 110.

Alternatively, separation at the interface between a metal layer and the organic resin may be performed in the following manner: the metal layer is provided between the support substrate and the organic resin and current is made to flow in the metal layer so that the metal layer is heated.

Figure 8:
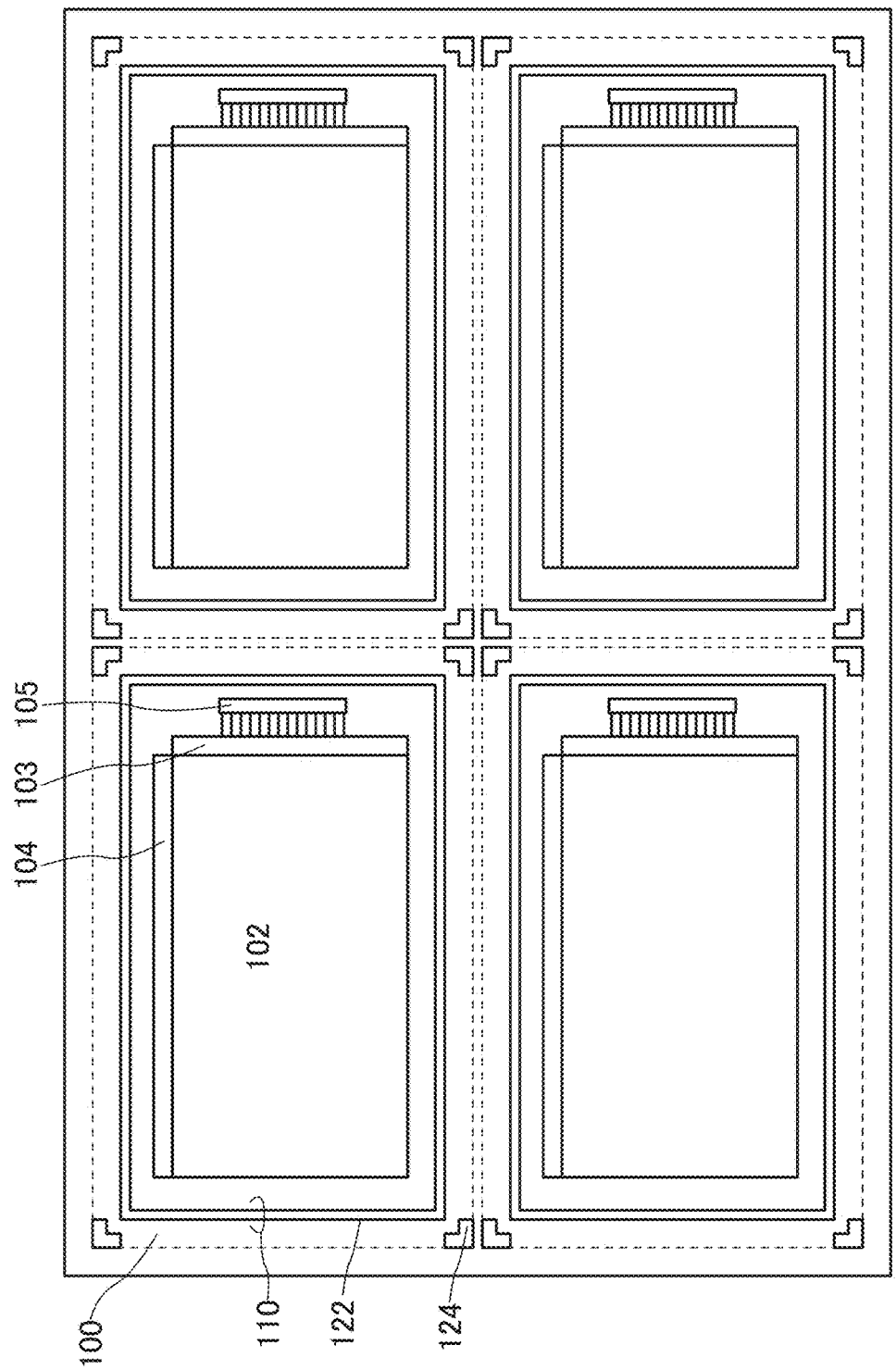
FIG. 8 illustrates a method for manufacturing a display device of one embodiment.

Although this manufacturing method shows a process of fabricating the one display device 100, in terms of productivity, a plurality of display devices 100 are preferably manufactured at a time over a large substrate. In that case, the substrate is cut along the markers 124, for example, after the bonding step or the separation step. FIG. 8 is a schematic top view of the four display devices 100 manufactured at a time over a large substrate. The substrate is cut along a dashed line to obtain each display device 100.

Through the above process, a display device with fewer defects caused by a crack can be provided.

Modification Example of Display Device

Modification examples of the display device 100 will be described below.

Modification Example 1

Figure 9:
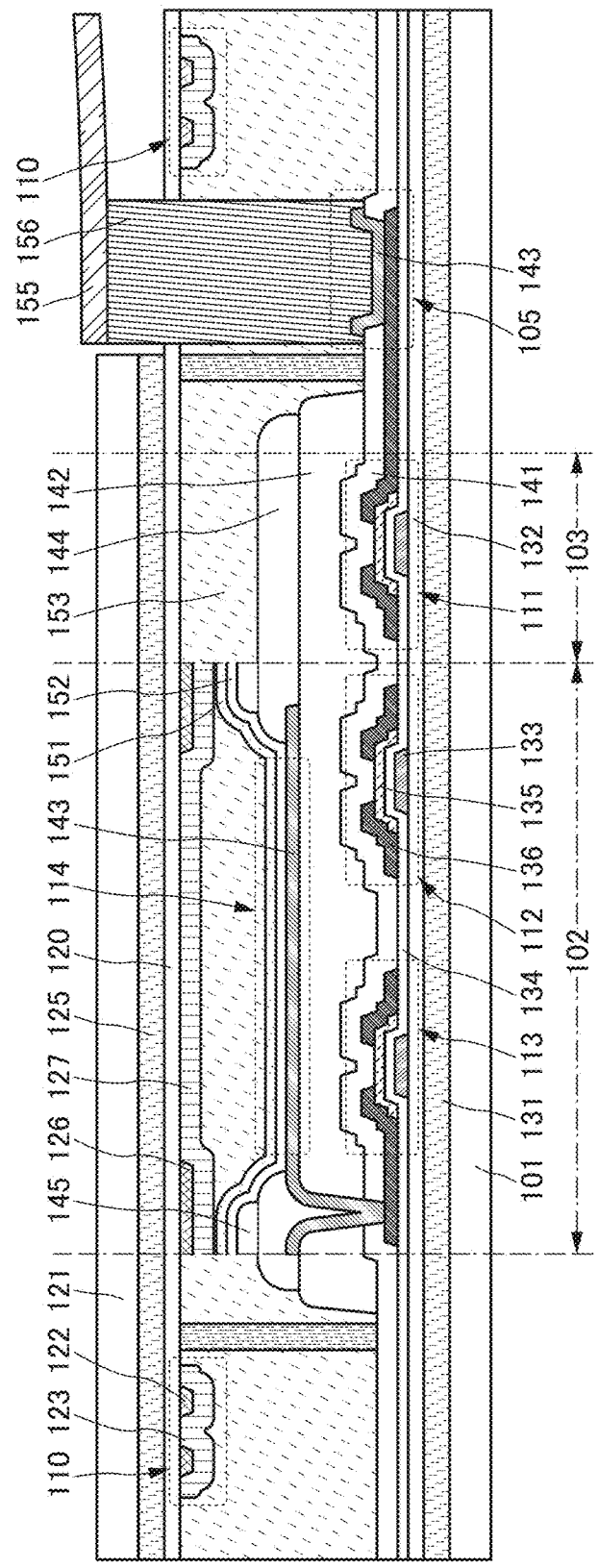
FIG. 9 illustrates a structure example of a display device of one embodiment.

FIG. 9 is a schematic cross-sectional view of the display device 100 that includes a cover layer 123 in contact with the crack inhibiting layer 122.

In the case where the marker 124 is not formed in the display device 100, the crack inhibiting layer 122 is preferably formed using the same material as the black matrix 126 so as not to increase the number of steps.

To prevent a crack more effectively, the cover layer 123 may be formed to cover a plurality of crack inhibiting layers 122. The development of the crack can be hindered when stress is distributed unevenly in the direction where the crack develops at the interface between the buffer layer 120 and each of the crack inhibiting layers 122 and the cover layer 123. Therefore, the cover layer 123 is preferably formed using a material different from that of the crack inhibiting layers 122. The cover layer 123 can be formed of a conductive material or a resin material.

In the display device 100 illustrated in FIG. 9, the crack inhibiting layers 122 are formed using the same material as the black matrix 126 and the cover layer 123 is formed using the same material as the color filter 127.

Note that in FIG. 9, an insulating layer 145 is formed over the insulating layer 144 in the display portion 102. The insulating layer 145 adjusts the distance between the first substrate 121 and the second substrate 101. The insulating layer 145 can be formed using the same material as the insulating layer 144.

Modification Example 2

Figure 10:
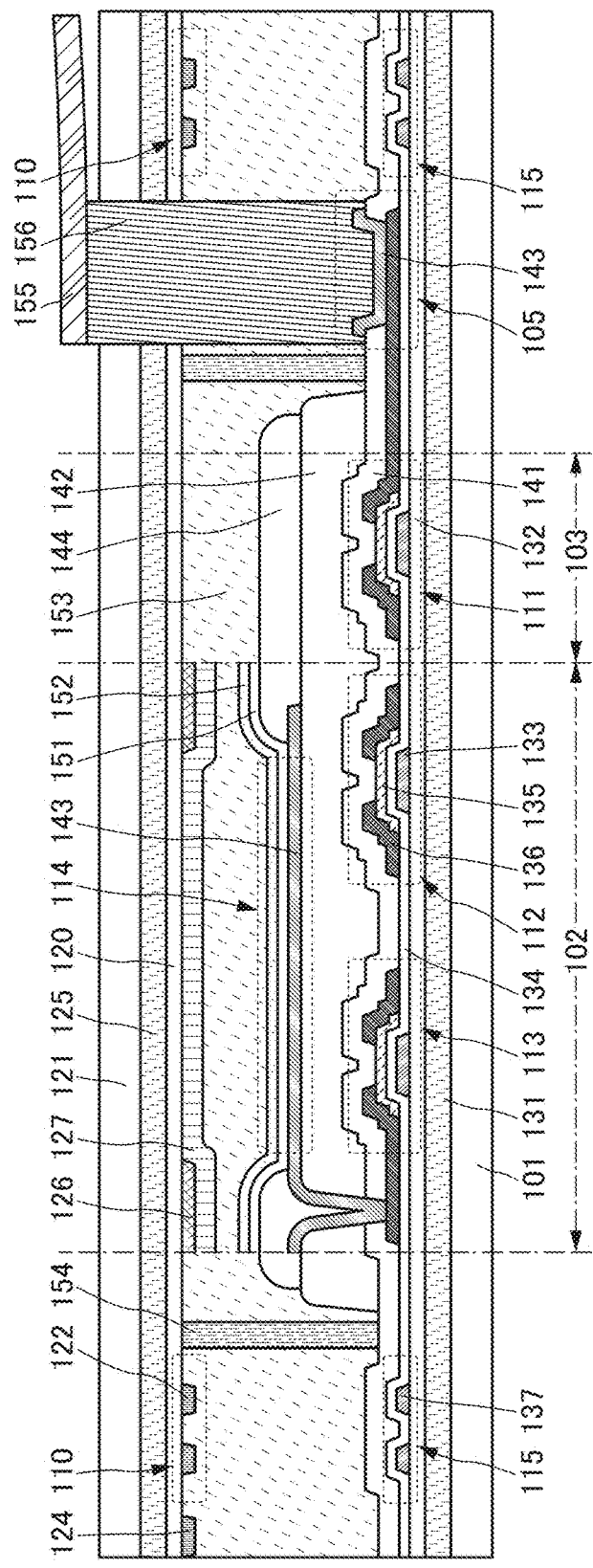
FIG. 10 illustrates a structure example of a display device of one embodiment.

FIG. 10 is a schematic cross-sectional view of the display device 100 that includes a second crack inhibiting region 115 over the buffer layer 132.

In the display device 100 illustrated in FIG. 10, the second crack inhibiting region 115 including a plurality of second crack inhibiting layers 137 is provided to overlap with the crack inhibiting region 110. When the second crack inhibiting region 115 is provided to surround not only the display portion 102 but also the signal line driver circuit 103, the scan line driver circuit 104, the external connection terminal 105, and the like, a crack generated from an end portion of the second buffer layer 132 can be prevented from reaching these portions, inhibiting failure such as the malfunction of the display device 100.

Note that the second crack inhibiting layer 137 is preferably formed in contact with the second buffer layer 132 with use of a conductive material or a resin material similarly to the crack inhibiting layer 122. In the display device 100 illustrated in FIG. 10, the second crack inhibiting layer 137 is formed using the same material as the gate electrode 133. The second crack inhibiting layer 137 is thus preferably formed using the same material as the electrode or wiring included in the transistors (111, 112, and 113) or the light-emitting element 114 so as not to increase the number of steps.

Modification Example 3

FIG. 11A is a schematic top view of the display device 100 in which the crack inhibiting region 110 is provided closer to the display portion 102 than the external connection terminal 105 is. FIG. 11B is a schematic cross-sectional view along lines A2-B2, C2-D2, and E2-F2 in FIG. 11A.

In the aforementioned manufacturing method, the crack inhibiting region 110 is provided outside the external connection terminal 105. In contrast, the crack inhibiting region 110 is provided inside the external connection terminal 105 in FIGS. 11A and 11B. When an opening is formed in the buffer layer 120 and the sealing layer 153 in a region overlapping with the external connection terminal 105 in the aforementioned manufacturing method, a crack might occur in an end portion of the opening in the buffer layer 120. In that case, the structure in FIGS. 11A and 11B prevents the crack from developing into the display portion 102.

In addition, the outer size of the display device 100 can be reduced when the crack inhibiting region 110 is provided inside the external connection terminal 105 as compared to the case where it is provided outside. This increases the number of display devices 100 that can be obtained at a time from one large substrate by a multiple panel method or the like.

Note that the display device including the light-emitting element is described in this embodiment as an example; however, one embodiment of the present invention is not limited to this example. A variety of semiconductor devices and a variety of display devices can be given as examples of devices in which flexible substrates that are a feature of one embodiment of the present invention can be used. For example, flexible substrates that are a feature of one embodiment of the present invention can be used as substrates in the following elements or devices. Examples include an EL element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), an interferometric modulator display (IMOD), a MEMS shutter display element, an optical interference type MEMS display element, an electrowetting element, a piezoelectric ceramic display, or a carbon nanotube, which are display media whose contrast, luminance, reflectivity, transmittance, or the like is changed by electromagnetic action. Examples further include a display device having electron emitters, such as a field emission display (FED) or an SED-type flat panel display (SED: surface-conduction electron-emitter display). Examples further include a display device having a liquid crystal element, such as a liquid crystal display (e.g., a transmissive liquid crystal display, a transflective liquid crystal display, a reflective liquid crystal display, a direct-view liquid crystal display, or a projection liquid crystal display). Examples further include a display device including electronic ink, electronic liquid powder, or electrophoretic elements, such as electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a storage circuit such as an SRAM can be provided under the reflective electrodes, leading to lower power consumption.

This embodiment can be implemented in an appropriate combination with the other embodiments and example described in this specification.

Embodiment 2

Described in this embodiment is a light-emitting module in which a touch panel having a function of a touch sensor is added to the display device shown in Embodiment 1. Note that the components similar to those in Embodiment 1 will not be described below.

Structure Example of Display Device

FIG. 12 is a schematic cross-sectional view of a light-emitting module 200.

A light-emitting module 200 includes the display device 100 and a touch sensor 201. The display device 100 includes the first substrate 121, the second substrate 101, and the display portion 102. The touch sensor 201 is provided on a surface of a substrate 221 that faces the display device 100, with a buffer layer 220 therebetween. Note that the first substrate 121, the second substrate 101, and the substrate 221 are all preferably flexible substrates.

A plurality of wirings 231 are electrically connected to the touch sensor 201. In addition, the plurality of wirings 231 are led to a peripheral portion of the substrate 221 and partly form a terminal. The terminal is electrically connected to an FPC 256 via a connector 255.

In the touch sensor 201, a crack inhibiting region 210 is provided in contact with the buffer layer 220. The crack inhibiting region 210 includes a plurality of crack inhibiting layers 222 formed using the same material as the plurality of wirings 231. By providing the crack inhibiting region 210 in a peripheral portion of the touch sensor 201, in the case where, for example, the light-emitting module 200 is held in a high temperature and high humidity environment, a crack generated in an end portion of the buffer layer 220 can be prevented from developing into the touch sensor 201.

As the touch sensor 201, a capacitive touch sensor can be used. Examples of the capacitive touch sensor include a surface capacitive touch sensor and a projected capacitive touch sensor.

Examples of the projected capacitive touch sensor include a self-capacitive touch sensor and a mutual capacitive touch sensor, which differ mainly in the driving method. The use of a mutual capacitive touch sensor is preferable because multiple points can be sensed simultaneously.

An example of using a projected capacitive touch sensor will be described below.

Note that the configuration of the touch sensor is not limited to the above, and a variety of sensors that can sense the closeness or the contact of a sensing target such as a finger can be used.

The projected capacitive touch sensor 201 includes electrodes 234 and electrodes 235. The electrodes 234 are electrically connected to any of the plurality of wirings 231, and the electrodes 235 are electrically connected to any of the other wirings 231.

A wiring 232 electrically connects the two electrodes 234 between which one of the electrodes 235 is positioned. The intersecting area of the electrode 235 and the wiring 232 is preferably as small as possible. Such a structure allows a reduction in the area of a region where the electrodes are not provided, reducing unevenness in transmittance. As a result, unevenness in the luminance of light transmitted through the touch sensor 201 can be reduced.

Note that the electrodes 234 and 235 can have any of a variety of shapes. For example, a structure may be employed in which the plurality of electrodes 234 are arranged so that gaps between the electrodes 234 are reduced as much as possible, and the plurality of electrodes 235 are spaced apart from the electrodes 234 with an insulating layer interposed therebetween to have regions not overlapping with the electrodes 234. In this case, it is preferable to provide, between two adjacent electrodes 235, a dummy electrode electrically insulated from these electrodes because the area of regions having different transmittances can be reduced.

In the touch sensor 201, a surface of the buffer layer 220 that faces the display device 100 is provided with the wiring 232 electrically connecting the adjacent electrodes 234, an insulating layer 233, the electrodes 234 and 235 provided in a staggered arrangement on the insulating layer 233, and an insulating layer 236.

With a bonding layer 225, the insulating layer 236 is attached to the surface of the first substrate 121 that does not face the light-emitting element 114 so that the touch sensor 201 overlaps with the display portion 102.

In this structure example, a top emission light-emitting module is used as the display device 100. In the case where the display device 100 is a bottom emission module, with the bonding layer 225, the insulating layer 236 is attached to the surface of the second substrate 101 that does not face the light-emitting element 114.

The buffer layer 220 has a function of inhibiting diffusion of impurities, particularly moisture, which have passed through the substrate 221. The buffer layer 220 can be formed using, for example, oxide or nitride of a semiconductor such as silicon or oxide or nitride of a metal such as aluminum. Alternatively, a layered film of such an inorganic insulating material or a layered film of such an inorganic insulating material and an organic insulating material may be used.

The wiring 232 is preferably formed using a light-transmitting conductive material, in which case the aperture ratio of the light-emitting module can be increased. As the light-transmitting conductive material, a conductive oxide such as indium oxide, indium oxide-tin oxide, indium oxide-zinc oxide, zinc oxide, and zinc oxide to which gallium is added, or graphene can be used.

The wiring 232 can be formed by depositing a light-transmitting conductive material on the buffer layer 220 by a sputtering method and then removing unnecessary portions by any of various patterning techniques such as a photolithography method. Graphene may be formed by a CVD method or by applying a solution in which graphene oxide is dispersed and then reducing the solution.

Examples of a material for the insulating layer 233 include a resin such as acrylic or epoxy resin, a resin having a siloxane bond, and an inorganic insulating material such as silicon oxide, silicon oxynitride, or aluminum oxide.

Furthermore, an opening reaching the wiring 232 is formed in the insulating layer 233, and the electrodes 234 and 235 are formed by a method similar to the manufacturing method of the wiring 232.

Each of the electrodes 235 extends in one direction, and a plurality of electrodes 235 are provided in the form of stripes.

The wiring 232 intersects with one of the electrodes 235. A pair of electrodes 234 are provided with one of the electrodes 235 provided therebetween. The wiring 232 electrically connects the adjacent electrodes 234.

Note that the plurality of electrodes 234 are not necessarily arranged in the direction orthogonal to one of the electrodes 235 and may be arranged to intersect with the electrode 235 at an angle of less than 90 degrees.

One of the wirings 231 is electrically connected to one of the electrodes 234 or one of the electrodes 235. Part of the wirings 231 serves as a terminal. For the wirings 231, a metal material such as aluminum, gold, platinum, silver, nickel, titanium, tungsten, chromium, molybdenum, iron, cobalt, copper, or palladium or an alloy material containing any of these metal materials can be used.

Note that an insulating layer for protecting the touch sensor 201 may be provided. In this structure example, the insulating layer 236 is provided to cover the insulating layer 233, the electrode 234, and the electrode 235.

Furthermore, a connector 255 electrically connects any of the wirings 231 to the FPC 256.

As the connector 255, an anisotropic conductive film (ACF), an anisotropic conductive paste (ACP), or the like can be used.

The bonding layer 225 has a light-transmitting property. For example, a thermosetting resin or an ultraviolet curable resin can be used; specifically, a resin such as an acrylic resin, a urethane resin, an epoxy resin, or a resin having a siloxane bond can be used.

At least part of this embodiment can be implemented in an appropriate combination with the other embodiments described in this specification.

Embodiment 3

Described in this embodiment is a display device having a structure different from the structures shown in Embodiments 1 and 2. Note that the components similar to those in Embodiment 1 will not be described below.

Structure Example of Display Device

A structure example of an image display device in which a liquid crystal element is used as a display element will be described below.

Figure 13A:
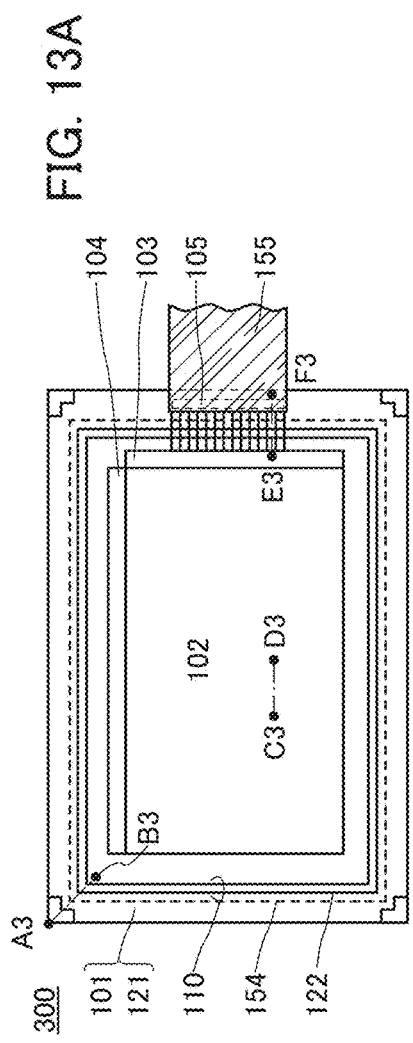
FIGS. 13A and 13B illustrate a structure example of a display device of one embodiment.
Figure 13B:
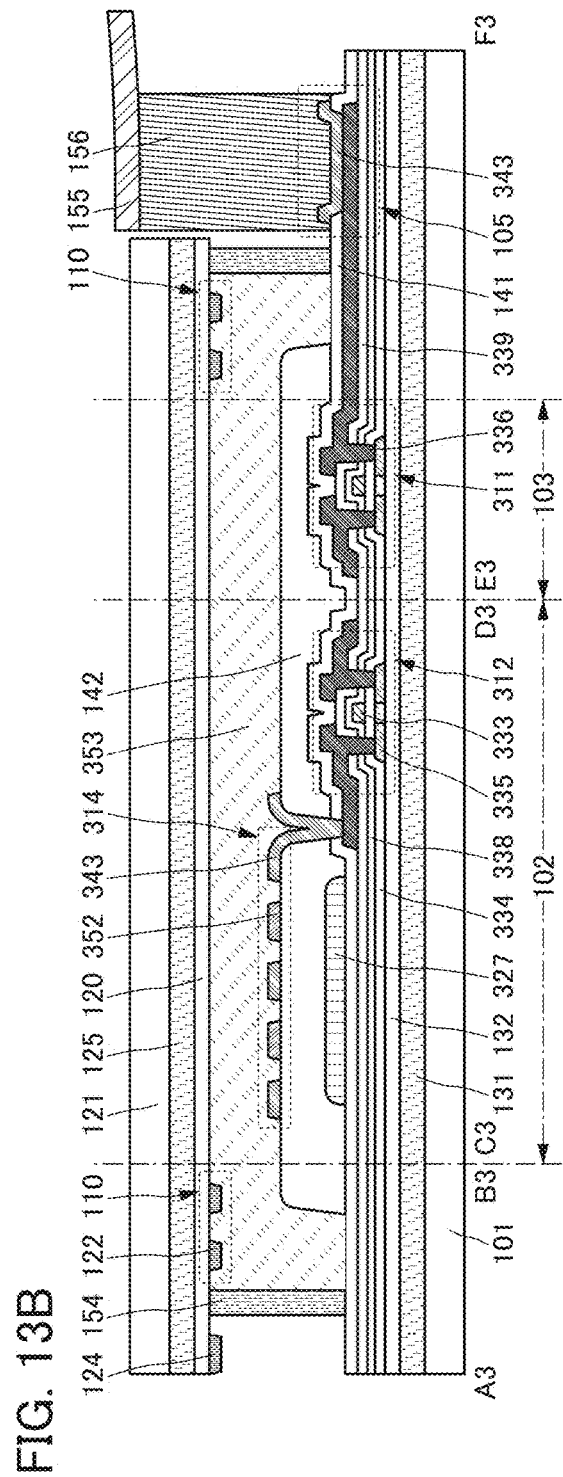

FIG. 13A is a schematic top view of a display device 300. FIG. 13B is a schematic cross-sectional view along lines A3-B3, C3-D3, and E3-F3 in FIG. 13A. The display device 300 differs from the display device 100 described in Embodiment 1 mainly in that a liquid crystal element is used as a display element, a transistor has a different structure, and a crack inhibiting region is arranged in a different area.

The display portion 102 includes a liquid crystal element 314 using an in-plane switching (IPS) mode. In the liquid crystal element 314, the orientation of a liquid crystal is controlled by an electric field generated in a direction parallel to the substrate surface.

A pixel includes at least one switching transistor 312 and a storage capacitor that is not illustrated. A comb-shaped second electrode 352 and a comb-shaped first electrode 343 electrically connected to one of a source electrode and a drain electrode of the transistor 312 are provided apart from each other over the insulating layer 142.

For at least one of the first electrode 343 and the second electrode 352, any of the above-described light-transmitting conductive materials is used. It is preferable to use a light-transmitting conductive material for both of these electrodes because the aperture ratio of the pixel can be increased Although the first electrode 343 and the second electrode 352 are distinguished from each other in FIG. 13B by using different hatch patterns, these electrodes are preferably formed by processing the same conductive film.

A color filter 327 is provided at a position overlapping with the first electrode 343 and the second electrode 352. The color filter 327 is provided over the insulating layer 141 in FIG. 13B, but the position of the color filter is not limited to this position.

A liquid crystal 353 is provided between the buffer layer 120 and each of the first electrode 343 and the second electrode 352. An image can be displayed in the following way: voltage is applied between the first electrode 343 and the second electrode 352 to generate an electric field in the horizontal direction, orientation of the liquid crystal 353 is controlled by the electric field, and polarization of light from a backlight provided outside the display device is controlled in each pixel.

Alignment films for controlling the orientation of the liquid crystal 353 are preferably provided on surfaces in contact with the liquid crystal 353. A light-transmitting material is used for the alignment films. Although not illustrated here, polarizing plates are provided on the surfaces of the first substrate 121 and the second substrate 101 that do not face the liquid crystal element 314.

As the liquid crystal 353, a thermotropic liquid crystal, a low-molecular liquid crystal, a high-molecular liquid crystal, a ferroelectric liquid crystal, an anti-ferroelectric liquid crystal, or the like can be used. Moreover, a liquid crystal exhibiting a blue phase is preferably used, in which case an alignment film is not needed and a wide viewing angle can be obtained.

A high-viscosity and low-fluidity material is preferably used for the liquid crystal 353.

Although the liquid crystal element 314 using an IPS mode is described here as an example, the mode of the liquid crystal element is not limited to this, and a twisted nematic (TN) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

The transistors (a transistor 311 and the transistor 312) in the display device 300 are top-gate transistors. Each of the transistors includes a semiconductor layer 335 having an impurity region serving as a source or drain region, an insulating layer 334 serving as a gate insulating layer, and a gate electrode 333. In addition, an insulating layer 338 and an insulating layer 339 are stacked to cover the gate electrode 333. A pair of electrodes 336 are provided so as to reach the source or drain region of the semiconductor layer 335 through an opening formed in the insulating layers 334, 338, and 339.

In FIGS. 13A and 13B, the crack inhibiting region 110 is provided closer to the display portion 102 than the sealant 154 is. When the crack inhibiting region 110 is thus provided sufficiently apart from the display portion 102, a crack generated in an end portion of the buffer layer 120 can be prevented from developing across the display portion 102, causing less misalignment of the liquid crystal element 314 and the like due to the entry of impurities such as moisture. Note that the crack inhibiting region 110 can also be provided outside the sealant 154 as in Embodiment 1.

Note that the top-gate transistor described here can be replaced with the bottom-gate transistor described in Embodiment 1. Alternatively, the transistor described in Embodiment 1 can be replaced with the top-gate transistor described here.

Note that for a display device of one embodiment of the present invention, an active matrix method in which an active element is included in a pixel or a passive matrix method in which an active element is not included in a pixel can be used.

In the active matrix method, as an active element (a non-linear element), not only a transistor but also various active elements (non-linear elements) can be used. For example, a metal insulator metal (MIM) or a thin film diode (TFD) can be used. Such an element has few numbers of manufacturing steps; thus, the manufacturing cost can be reduced or yield can be improved. Furthermore, because the size of the element is small, the aperture ratio can be improved, leading to lower power consumption or higher luminance.

As a method other than the active matrix method, the passive matrix method in which an active element (a non-linear element) is not used may be used. Since an active element (a non-linear element) is not used, the number of manufacturing steps is small, so that the manufacturing cost can be reduced or yield can be improved. Furthermore, since an active element (a non-linear element) is not used, the aperture ratio can be improved, leading to lower power consumption or higher luminance.

At least part of this embodiment can be implemented in an appropriate combination with the other embodiments described in this specification.

Embodiment 4

In this embodiment, structure examples of a light-emitting device will be described.

Structure Example of Display Device

Figure 14A:
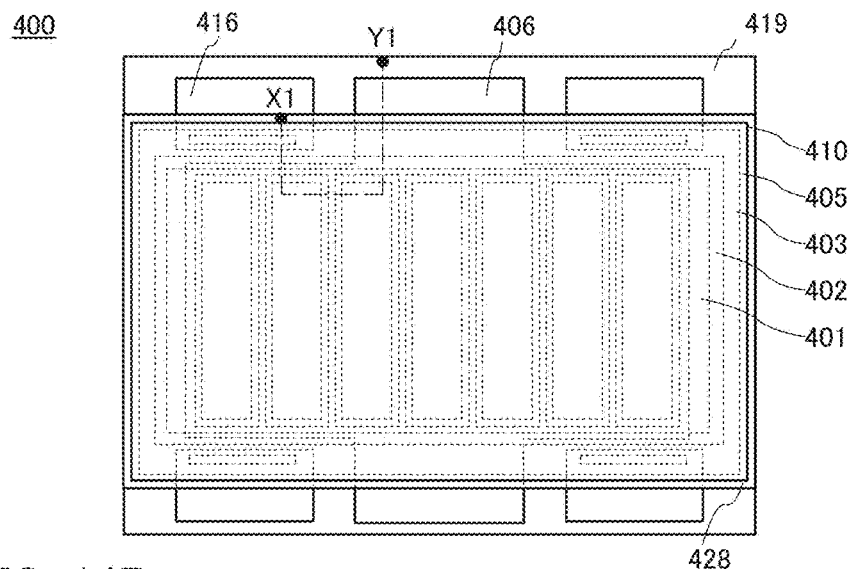
FIGS. 14A to 14C illustrate a structure example of a light-emitting device of one embodiment.
Figure 14B:
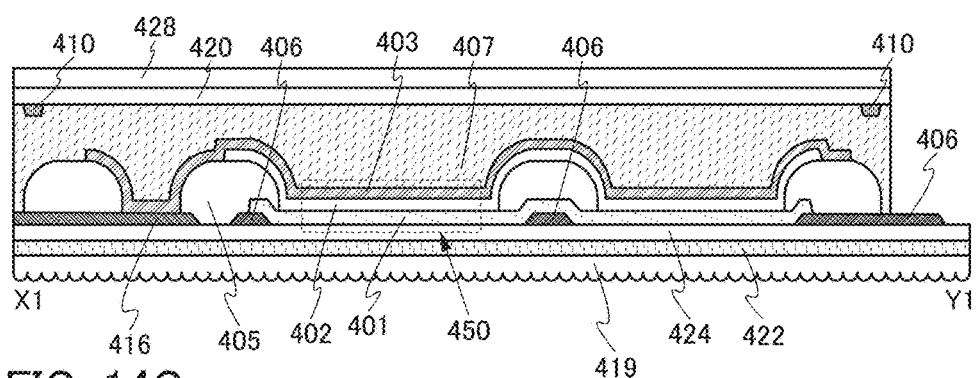
Figure 14C:
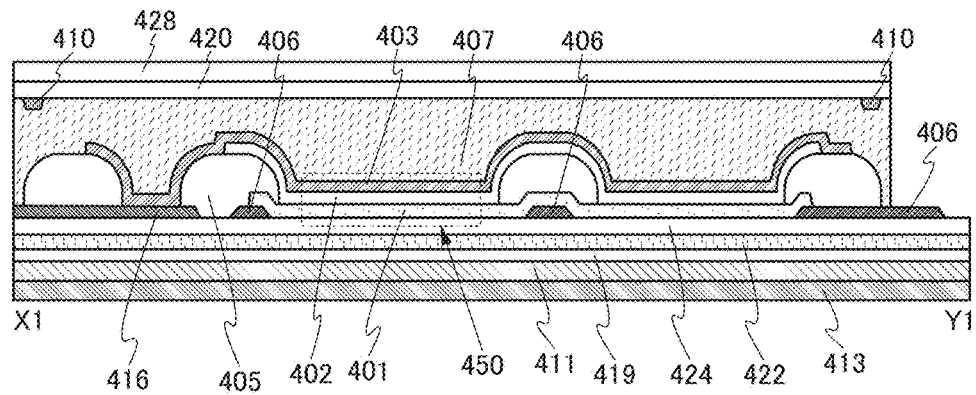

FIGS. 14A to 14C illustrate examples of a flexible light-emitting device including an organic EL element as a light-emitting element.

FIG. 14A is a schematic top view of a light-emitting device 400. FIG. 14B is a schematic cross-sectional view along line X1-Y1 in FIG. 14A. FIGS. 14A and 14B illustrate bottom-emission light-emitting devices.

As illustrated in FIG. 14B, the light-emitting device 400 includes a second substrate 419, a bonding layer 422, a second buffer layer 424, a conductive layer 406, a conductive layer 416, an insulating layer 405, a light-emitting element 450 (a first electrode 401, an EL layer 402, and a second electrode 403), a sealing layer 407, a crack inhibiting layer 410, a buffer layer 420, and a first substrate 428. The first electrode 401, the second buffer layer 424, the bonding layer 422, and the second substrate 419 transmit visible light. The first substrate 428 and the second substrate 419 are preferably flexible substrates.

The crack inhibiting layer 410 is provided so as to be in contact with the buffer layer 420 and surround the light-emitting element 450. When the crack inhibiting layer 410 is thus provided sufficiently apart from the light-emitting element 450, a crack generated in an end portion of the buffer layer 420 can be prevented from developing. This reduces the entry of impurities such as moisture into the light-emitting element 450, whereby a highly reliable light-emitting device 400 can be provided.

The light-emitting element 450 is provided over the second substrate 419 with the bonding layer 422 and the second buffer layer 424 therebetween. The light-emitting element 450 is sealed by the second substrate 419, the sealing layer 407, and the first substrate 428. The light-emitting element 450 includes the first electrode 401, the EL layer 402 over the first electrode 401, and the second electrode 403 over the EL layer 402. It is preferable that the second electrode 403 reflect visible light.

End portions of the first electrode 401, the conductive layer 406, and the conductive layer 416 are covered with the insulating layer 405. The conductive layer 406 is electrically connected to the first electrode 401, and the conductive layer 416 is electrically connected to the second electrode 403. The conductive layer 406 covered with the insulating layer 405 with the first electrode 401 therebetween is electrically connected to the first electrode 401 and therefore functions as an auxiliary wiring. It is preferable that the electrode of the EL element include the auxiliary wiring, in which case a voltage drop due to the electrical resistance of the electrode can be inhibited. Note that the conductive layer 406 may be provided over the first electrode 401. Furthermore, an auxiliary wiring that is electrically connected to the second electrode 403 may be provided, for example, over the insulating layer 405.

To increase the outcoupling efficiency of the light-emitting device, a light outcoupling structure is preferably provided on the side from which light emitted from the light-emitting element 450 is extracted. FIG. 14B illustrates an example in which the second substrate 419 from which the light emitted from the light-emitting element 450 is extracted also serves as the light outcoupling structure. Note that a touch sensor or the light outcoupling structure such as a sheet having a function of diffusing light may be provided so as to overlap with the second substrate 419. Moreover, a polarizing plate or a retardation plate may be provided. FIG. 14C illustrates a case where a diffusion plate 411 and a touch sensor 413 are provided so as to overlap with the second substrate 419.

At least part of this embodiment can be implemented in an appropriate combination with the other embodiments described in this specification.

Embodiment 5

In this embodiment, electronic devices and lighting devices that can include the light-emitting device or the display device of one embodiment of the present invention will be described with reference to FIGS. 15A to 15C, FIGS. 16A to 16I, and FIGS. 17A to 17C.

The display device of one embodiment of the present invention has a bendable display surface. Examples of such a display device include a television set (also referred to as television or television receiver), a monitor of a computer, a camera such as a digital camera or a digital video camera, a digital photo frame, a mobile phone set (also referred to as cellular phone or mobile phone device), a portable game machine, a portable information terminal, an audio reproducing device, and a large game machine such as a pachinko machine.

In addition, a lighting device or a display device can be incorporated along a curved inside/outside wall surface of a house or a building or a curved interior/exterior surface of a car.

Figure 15A:
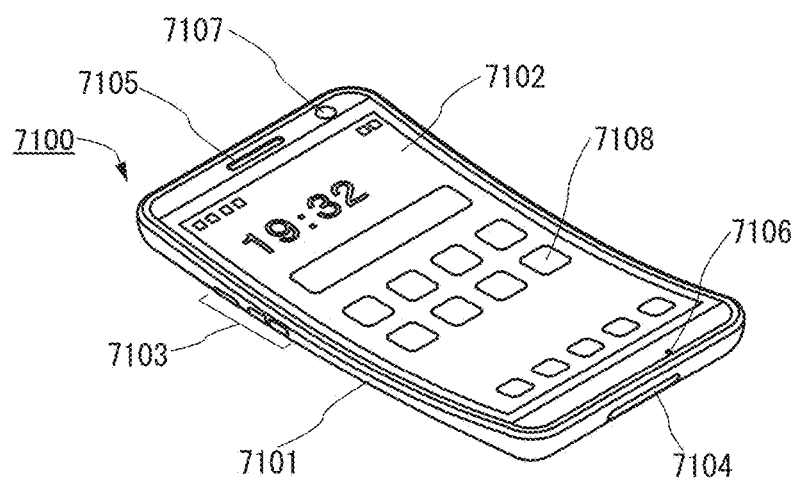
FIGS. 15A to 15C illustrate structure examples of an electronic device of one embodiment.

FIG. 15A illustrates an example of a cellular phone. A cellular phone 7100 includes a display portion 7102 incorporated in a housing 7101, operation buttons 7103, an external connection port 7104, a speaker 7105, a microphone 7106, a camera 7107, and the like. Note that the cellular phone 7100 is manufactured using the display device of one embodiment of the present invention for the display portion 7102.

When the display portion 7102 of the cellular phone 7100 illustrated in FIG. 15A is touched with a finger or the like, data can be input into the cellular phone 7100. Moreover, operations such as making a call and inputting a letter can be performed by touch on the display portion 7102 with a finger or the like. For example, by touching an icon 7108 displayed on the display portion 7102, application can be started.

With the operation buttons 7103, power on or off can be switched. In addition, a variety of images displayed on the display portion 7102 can be switched, for example, from a mail creation screen to a main menu screen.

Here, the display portion 7102 includes the display device of one embodiment of the present invention. Thus, a highly reliable cellular phone having a curved display portion can be provided.

Figure 15B:
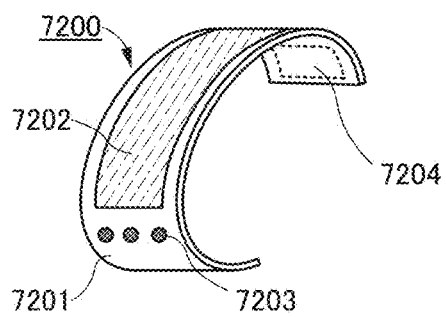

FIG. 15B is an example of a wristband-type display device. A portable display device 7200 includes a housing 7201, a display portion 7202, operation buttons 7203, and a sending and receiving device 7204.

The portable display device 7200 can receive a video signal with the sending and receiving device 7204 and can display the received video on the display portion 7202. In addition, with the sending and receiving device 7204, the portable display device 7200 can send an audio signal to another receiving device.

With the operation buttons 7203, power on/off, switching of displayed videos, adjusting volume, and the like can be performed.

Here, the display portion 7202 includes the display device of one embodiment of the present invention. Thus, a highly reliable portable display device having a curved display portion can be provided.

Figure 15C:
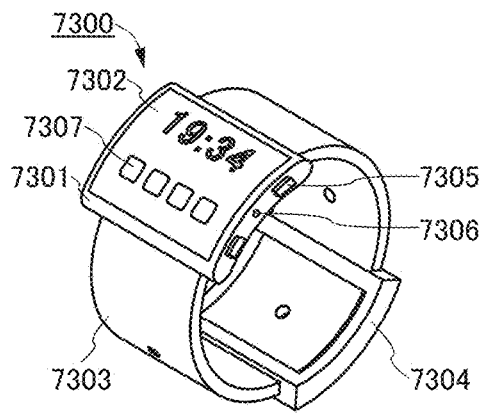

FIG. 15C illustrates an example of a wrist-watch-type portable information terminal. A portable information terminal 7300 includes a housing 7301, a display portion 7302, a band 7303, a buckle 7304, an operation button 7305, an input/output terminal 7306, and the like.

The portable information terminal 7300 is capable of executing a variety of applications such as mobile phone calls, e-mailing, reading and editing texts, music reproduction, Internet communication, and a computer game.

The display surface of the display portion 7302 is bent, and images can be displayed on the bent display surface. Furthermore, the display portion 7302 includes a touch sensor, and operation can be performed by touching the screen with a finger, a stylus, or the like. For example, by touching an icon 7307 displayed on the display portion 7302, an application can be started.

With the operation button 7305, a variety of functions such as time setting, power on/off, on/off of wireless communication, setting and cancellation of manner mode, and setting and cancellation of power saving mode can be performed. For example, the functions of the operation button 7305 can be set freely by setting the operation system incorporated in the portable information terminal 7300.

The portable information terminal 7300 can employ near field communication that is a communication method based on an existing communication standard. In that case, for example, mutual communication between the portable information terminal 7300 and a headset capable of wireless communication can be performed, and thus hands-free calling is possible.

Moreover, the portable information terminal 7300 includes the input/output terminal 7306, and data can be directly transmitted to and received from another information terminal via a connector. Charging through the input/output terminal 7306 is also possible. Note that the charging operation may be performed by wireless power feeding without using the input/output terminal 7306.

The display device of one embodiment of the present invention can be used for the display portion 7302 of the portable information terminal 7300. Thus, a highly reliable portable information terminal having a curved display portion can be provided.

Figure 16A:
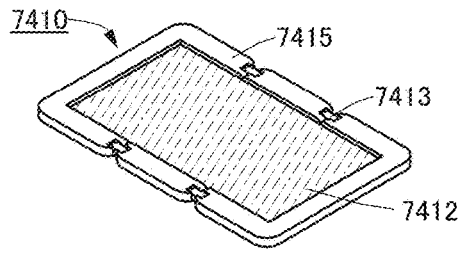
FIGS. 16A to 16I illustrate structure examples of an electronic device of one embodiment.
Figure 16B:
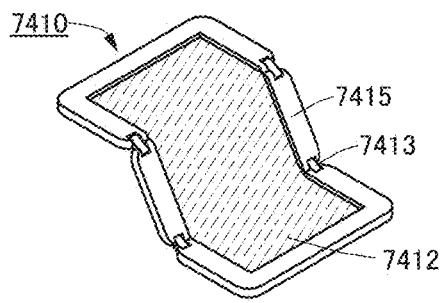
Figure 16C:
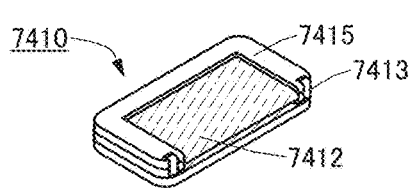

FIGS. 16A to 16C illustrate a foldable portable information terminal 7410. FIG. 16A illustrates the portable information terminal 7410 that is opened. FIG. 16B illustrates the portable information terminal 7410 that is being opened or being folded. FIG. 16C illustrates the portable information terminal 7410 that is folded. The portable information terminal 7410 is highly portable when folded. The portable information terminal 7410 is highly browsable when opened because of its seamless large display region.

A display panel 7412 is supported by three housings 7415 joined together by hinges 7413. By folding the portable information terminal 7410 at a connection portion between two housings 7415 with the hinges 7413, the portable information terminal 7410 can be reversibly changed in shape from an opened state to a folded state. A display device fabricated by employing one embodiment of the present invention can be used for the display panel 7412. For example, a display device that can be bent with a radius of curvature of greater than or equal to 1 mm and less than or equal to 150 mm can be used.

Figure 16D:
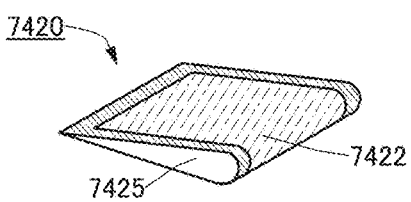
Figure 16E:
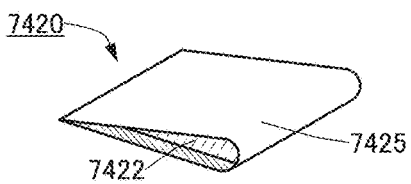

FIGS. 16D and 16E each illustrate a foldable portable information terminal 7420. FIG. 16D illustrates the portable information terminal 7420 that is folded so that a display portion 7422 is on the outside. FIG. 16E illustrates the portable information terminal 7420 that is folded so that the display portion 7422 is on the inside. When the portable information terminal 7420 is not used, the portable information terminal 7420 is folded so that a non-display portion 7425 faces the outside, whereby the display portion 7422 can be prevented from being contaminated or damaged. A display device formed by employing one embodiment of the present invention can be used for the display portion 7422.

Figure 16F:
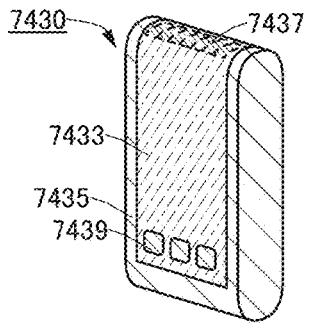
Figure 16G:
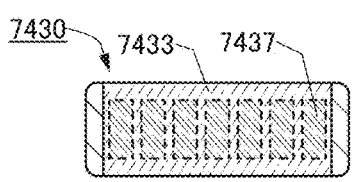
Figure 16H:
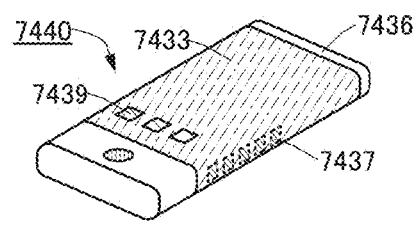

FIG. 16F is a perspective view illustrating an external shape of the portable information terminal 7430. FIG. 16G is a top view of the portable information terminal 7430. FIG. 16H is a perspective view illustrating an external shape of a portable information terminal 7440.

The portable information terminals 7430 and 7440 each function as, for example, one or more of a telephone set, a notebook, and an information browsing system. Specifically, the portable information terminals 7430 and 7440 each can be used as a smartphone.

The portable information terminals 7430 and 7440 can display characters and image information on its plurality of surfaces. For example, three operation buttons 7439 can be displayed on one surface (FIGS. 16F and 16H). In addition, information 7437 indicated by dashed rectangles can be displayed on another surface (FIGS. 16G and 16H). Examples of the information 7437 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation buttons 7439, an icon, or the like may be displayed in place of the information 7437. Although FIGS. 16F and 16G illustrate an example in which the information 7437 is displayed at the top, one embodiment of the present invention is not limited thereto. The information may be displayed on the side, for example, as in the portable information terminal 7440 illustrated in FIG. 16H.

For example, a user of the portable information terminal 7430 can see the display (here, the information 7437) with the portable information terminal 7430 put in a breast pocket of his/her clothes.

Specifically, a caller's phone number, name, or the like of an incoming call is displayed in a position that can be seen from above the portable information terminal 7430. Thus, the user can see the display without taking out the portable information terminal 7430 from the pocket and decide whether to answer the call.

A display device fabricated by employing one embodiment of the present invention can be used for a display portion 7433 mounted in each of a housing 7435 of the portable information terminal 7430 and a housing 7436 of the portable information terminal 7440. Thus, a highly reliable portable information terminal having a curved display portion can be provided.

Figure 16I:
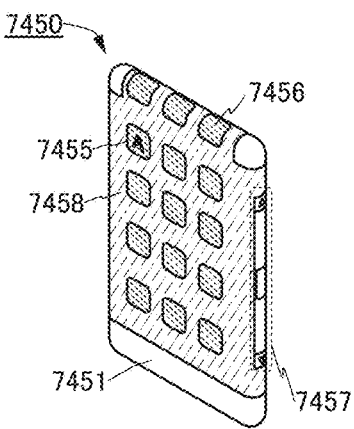

As in a portable information terminal 7450 illustrated in FIG. 16I, data may be displayed on three or more surfaces. Here, data 7455, data 7456, and data 7457 are displayed on different surfaces.

A display device fabricated by employing one embodiment of the present invention can be used for a display portion 7458 mounted in a housing 7451 of the portable information terminal 7450. Thus, a highly reliable portable information terminal having a curved display portion can be provided.

The display device of one embodiment of the present invention can be used in any of the display portions of the electronic devices described in this embodiment. Accordingly, a highly reliable electronic device that has a curved display surface and has fewer defects due to bending can be achieved.

Figure 17A:
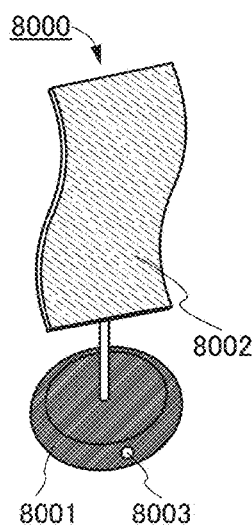
FIGS. 17A to 17C illustrate structure examples of a lighting device of one embodiment.
Figure 17B:
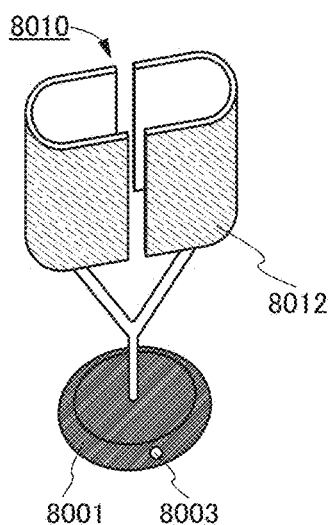
Figure 17C:
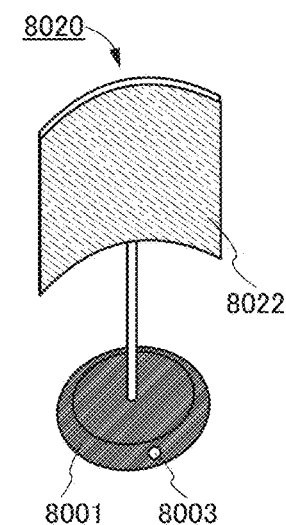

FIGS. 17A to 17C illustrate examples of a lighting device. Lighting devices 8000, 8010, and 8020 each include a stage 8001 provided with an operation switch 8003 and a light-emitting portion supported by the stage 8001.

The lighting device 8000 illustrated in FIG. 17A includes a light-emitting portion 8002 having a wave-shaped light-emitting surface, and thus has good design.

A light-emitting portion 8012 included in the lighting device 8010 illustrated in FIG. 17B has two convex-curved light-emitting portions symmetrically placed. Thus, light radiates from the lighting device 8010 in all directions.

The lighting device 8020 illustrated in FIG. 17C includes a concave-curved light-emitting portion 8022. This is suitable for illuminating a specific range because light emitted from the light-emitting portion 8022 is collected to the front of the lighting device 8020.

The light-emitting portion included in each of the lighting devices 8000, 8010, and 8020 are flexible; thus, the light-emitting portion may be fixed on a plastic member, a movable frame, or the like so that an emission surface of the light-emitting portion can be bent freely depending on the intended use.

Here, light-emitting portions 8002, 8012, and 8022 each include the light-emitting device of one embodiment of the present invention. Thus, a highly reliable lighting device having a curved display portion can be provided.

This embodiment can be implemented in an appropriate combination with the other embodiments and example described in this specification.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Note that contents that are not specified in any drawing or text in the specification can be excluded from one embodiment of the invention. Alternatively, when the range of a value that is defined by the maximum and minimum values is described, part of the range is appropriately narrowed or part of the range is removed, whereby one embodiment of the invention excluding part of the range can be constituted. In this manner, it is possible to specify the technical scope of one embodiment of the present invention so that a conventional technology is excluded, for example.

As a specific example, a diagram of a circuit including a first transistor to a fifth transistor is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, a description "a voltage is preferred to be 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, a description "a film is an insulating film" is given to describe properties of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a stacked film of four or more layers is excluded from the invention. For example, it can be specified that the case where a conductive film is provided between the A film and the film is excluded from the invention.

Note that various people can implement one embodiment of the invention described in this specification and the like. However, different people may be involved in the implementation of the invention. For example, in the case of a transmission/reception system, the following case is possible: Company A manufactures and sells transmitting devices, and Company B manufactures and sells receiving devices. As another example, in the case of a light-emitting device including a transistor and a light-emitting element, the following case is possible: Company A manufactures and sells semiconductor devices including transistors, and Company B purchases the semiconductor devices, provides light-emitting elements for the semiconductor devices, and completes light-emitting devices.

In such a case, one embodiment of the invention can be constituted so that a patent infringement can be claimed against each of Company A and Company B. In other words, one embodiment of the invention can be constituted so that only Company A implements the embodiment, and another embodiment of the invention can be constituted so that only Company B implements the embodiment. One embodiment of the invention with which a patent infringement suit can be filed against Company A or Company B is clear and can be regarded as being disclosed in this specification or the like. For example, in the case of a transmission/reception system, even when this specification or the like does not include a description of the case where a transmitting device is used alone or the case where a receiving device is used alone, one embodiment of the invention can be constituted by only the transmitting device and another embodiment of the invention can be constituted by only the receiving device. Those embodiments of the invention are clear and can be regarded as being disclosed in this specification or the like. Another example is as follows: in the case of a light-emitting device including a transistor and a light-emitting element, even when this specification or the like does not include a description of the case where a semiconductor device including the transistor is used alone or the case where a light-emitting device including the light-emitting element is used alone, one embodiment of the invention can be constituted by only the semiconductor device including the transistor and another embodiment of the invention can be constituted by only the light-emitting device including the light-emitting element. Those embodiments of the invention are clear and can be regarded as being disclosed in this specification or the like.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the invention can be clear. Furthermore, it can be determined that one embodiment of the invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, in a diagram or a text described in one embodiment, it is possible to take out part of the diagram or the text and constitute an embodiment of the invention. Thus, in the case where a diagram or a text related to a certain portion is described, the context taken out from part of the diagram or the text is also disclosed as one embodiment of the invention, and one embodiment of the invention can be constituted. The embodiment of the invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which N elements (N is an integer) are provided. As another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the invention is clear.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the invention is clear.

Example

In this example, a display device of one embodiment of the present invention was fabricated and subjected to a reliability test under a high temperature and high humidity environment. The results will be described below.

In this example, a sample a, which is a display device of one embodiment of the present invention, and a sample b, which is a display device of a comparative example, were fabricated.

Note that the samples in this example were manufactured by the method shown in Embodiment 1.

[Fabrication of Sample]

Materials used for the sample a and the comparative sample b will be described with reference to FIG. 9.

A plastic film with a thickness of approximately 20 μm was used as the first substrate 121 and the second substrate 101.

A two-component epoxy resin was used for the bonding layers 125 and 131 and the sealing layer 153.

Each of the buffer layer 120 and the second buffer layer 132 was formed using a layered film of a silicon oxynitride film with a thickness of approximately 600 nm, a silicon nitride film with a thickness of approximately 200 nm, a silicon oxynitride film with a thickness of approximately 200 nm, a silicon nitride oxide film with a thickness of approximately 140 nm, and a silicon oxynitride film with a thickness of approximately 100 nm.

Only in the sample a, the crack inhibiting layer 122 was formed using a titanium film with a thickness of approximately 100 nm, and the cover layer 123 was formed using an acrylic resin film with a thickness of approximately 2.0 μm.

The insulating layer 134 was formed using a layered film of a silicon nitride film with a thickness of approximately 400 nm and a silicon oxynitride film with a thickness of approximately 50 nm. The insulating layer 141 was formed using a layered film of a silicon oxynitride film with a thickness of approximately 450 nm and a silicon nitride film with a thickness of approximately 100 nm. An acrylic resin film with a thickness of approximately 2.0 μm was used as the insulating layer 142. A polyimide resin film with a thickness of approximately 1.0 μm was used as the insulating layer 144.

[Observation of Crack]

The sample a and the comparative sample b were subjected to a reliability test; then, the crack inhibiting region and the vicinity thereof were observed with an optical microscope. In the reliability test, the sample a and the comparative sample b were held in a high temperature and high humidity environment (temperature: 65° C., and humidity: 90%).

Figure 18A:
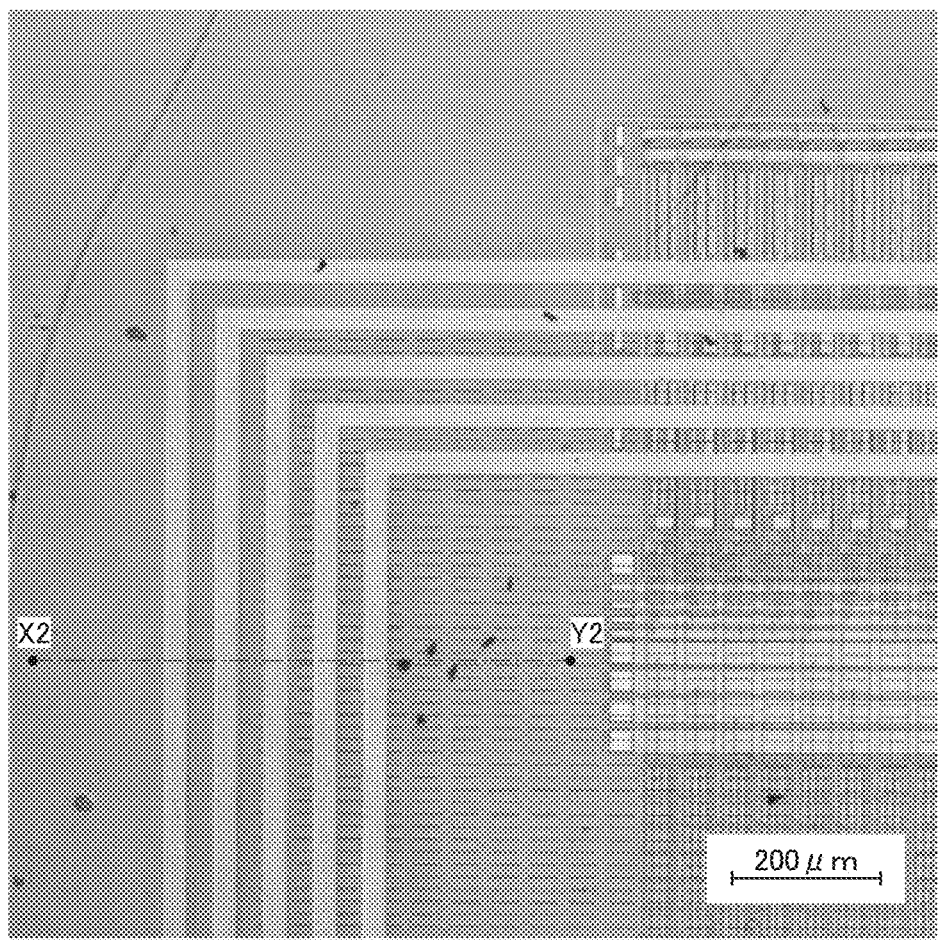
FIGS. 18A and 18B are respectively an optical micrograph and a cross-sectional view of Example.
Figure 18B:
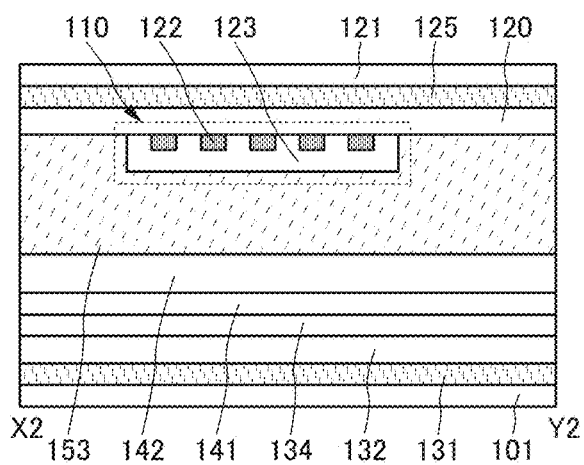
Figure 19A:
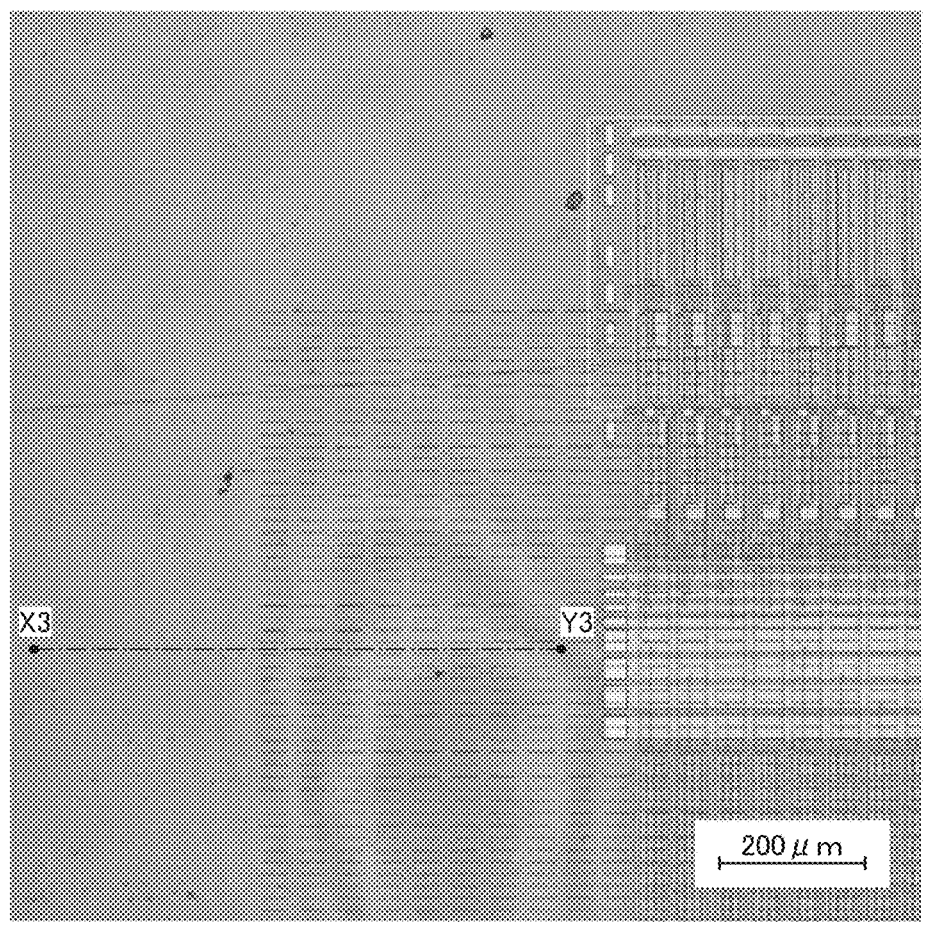
FIGS. 19A and 19B are respectively an optical micrograph and a cross-sectional view of Example.
Figure 19B:
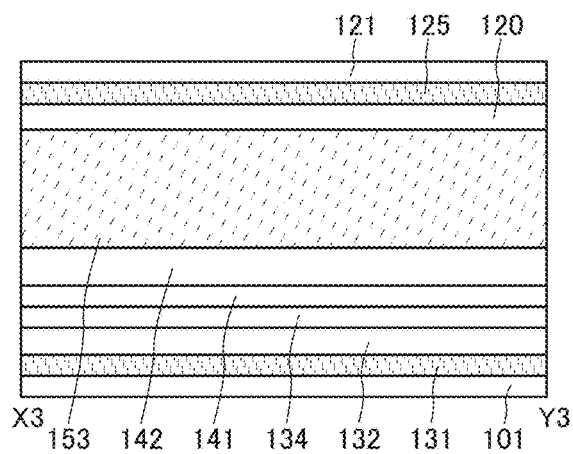

FIG. 18A and FIG. 19A show optical micrographs. FIG. 18B and FIG. 19B are schematic cross-sectional views along lines X2-Y2 and X3-Y3, respectively.

FIG. 18A is an optical micrograph of the sample a that was held in the high temperature and high humidity environment for approximately 600 hours. In the micrograph, a crack is generated from the top down, but the development of the crack stops before the crack inhibiting region 110.

FIG. 19A is an optical micrograph of the comparative sample b that was held in the high temperature and high humidity environment for approximately 600 hours. A crack is generated from the left of the micrograph and develops into the scan line driver circuit portion.

Figure 20:
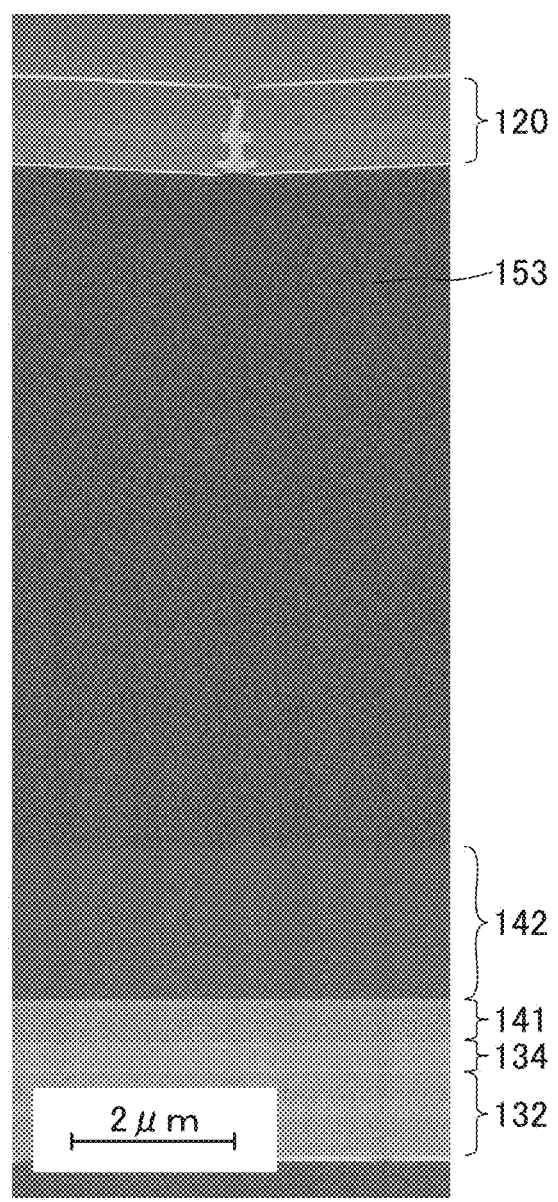
FIG. 20 is a transmission electron microscopy image of Example.

Another sample that is different from the comparative sample b only in the material of the insulating layer 142 was fabricated and a cross section thereof was observed. Then, a crack was found in the buffer layer 120 (FIG. 20). The insulating layer 142 in this sample was formed using a polyimide resin film with a thickness of approximately 2.0 μm. The above results indicate that the development of a crack generated in the buffer layer 120 can be hindered by providing the crack inhibiting region 110 in contact with the buffer layer 120.

As a result, the crack inhibiting layer on the outer edge of the display device was found to be effective for preventing the development of a crack.

This application is based on Japanese Patent Application serial No. 2014-043742 filed with Japan Patent Office on Mar. 6, 2014, the entire contents of which are hereby incorporated by reference.

EXPLANATION OF REFERENCE

100: display device, 101: substrate, 102: display portion, 103: signal line driver circuit, 104: scan line driver circuit, 105: external connection terminal, 110: crack inhibiting region, 111: transistor, 112: transistor, 113: transistor, 114: light-emitting element, 115: crack inhibiting region, 120: buffer layer, 120a: buffer layer, 120b: buffer layer, 121: substrate, 122: crack inhibiting layer, 123: cover layer, 124: marker, 125: bonding layer, 126: black matrix, 127: color filter, 128: organic resin layer, 131: bonding layer, 132: buffer layer, 133: gate electrode, 134: insulating layer, 135: semiconductor layer, 136: electrode, 137: crack inhibiting layer, 138: organic resin layer, 141: insulating layer, 142: insulating layer, 143: electrode, 144: insulating layer, 145: insulating layer, 151: EL layer, 152: electrode, 153: sealing layer, 154: sealant, 155: FPC, 156: connector, 161: support substrate, 162: separation layer, 163: support substrate, 164: separation layer, 200: light-emitting module, 201: touch sensor, 210: crack inhibiting region, 220: buffer layer, 221: substrate, 222: crack inhibiting layer, 225: bonding layer, 231: wiring, 232: wiring, 233: insulating layer, 234: electrode, 235: electrode, 236: insulating layer, 255: connector, 256: FPC, 300: display device, 311: transistor, 312: transistor, 314: liquid crystal element 327: color filter, 333: gate electrode, 334: insulating layer, 335: semiconductor layer, 336: electrode, 338: insulating layer, 339: insulating layer, 343: electrode, 352: electrode, 353: liquid crystal, 400: light-emitting device, 401: electrode, 402: EL layer, 403: electrode, 405: insulating layer, 406: conductive layer, 407: sealing layer, 410: crack inhibiting layer, 411: diffusion plate, 413: touch sensor, 416: conductive layer, 419: substrate, 420: buffer layer, 422: bonding layer, 424: buffer layer, 428:

substrate, 450: light-emitting element, 7100: cellular phone, 7101: housing, 7102: display portion, 7103: operation button, 7104: external connection port, 7105: speaker, 7106: microphone, 7107: camera, 7108: icon, 7200: portable display device, 7201: housing, 7202: display portion, 7203: operation button, 7204: sending and receiving device, 7300: portable information terminal, 7301: housing, 7302: display portion, 7303: band, 7304: buckle, 7305: operation button, 7306: input/output terminal, 7307: icon, 7410: portable information terminal, 7412: display panel, 7413: hinge, 7415: housing, 7420: portable information terminal, 7422: display portion, 7425: non-display portion, 7430: portable information terminal, 7433: display portion, 7435: housing, 7436: housing, 7437: information, 7439: operation button, 7440: portable information terminal, 7450: portable information terminal, 7451: housing, 7455: data, 7456: data, 7457: data, 7458: display portion, 8000: lighting device, 8001: stage, 8002: light-emitting portion, 8003: operation switch, 8010: lighting device, 8012: light-emitting portion, 8020: lighting device, and 8022: light-emitting portion.

The invention claimed is:

1. A light-emitting device comprising a first flexible substrate, a second flexible substrate, a first buffer layer, a first crack inhibiting layer, a light-emitting element, and a sealant,
   wherein a first surface of the first flexible substrate faces a second surface of the second flexible substrate,
   wherein the first flexible substrate is bonded to the second flexible substrate with the sealant interposed therebetween,
   wherein the first buffer layer and the first crack inhibiting layer are provided over the first surface of the first flexible substrate,
   wherein the sealant is provided in a peripheral region of the first surface of the first flexible substrate,
   wherein the first crack inhibiting layer is provided outside the sealant,
   wherein a thickness of the first crack inhibiting layer is smaller than a thickness of the sealant,
   wherein the first buffer layer overlaps with the first crack inhibiting layer, and
   wherein the light-emitting element is provided over the second surface of the second flexible substrate.

2. The light-emitting device according to claim 1,
   wherein the first buffer layer includes an inorganic material,
   wherein the light-emitting element includes a light-emitting organic compound, and
   wherein the first crack inhibiting layer includes a conductive material or a resin material.

3. The light-emitting device according to claim 1,
   wherein a first bonding layer is provided between the first flexible substrate and the first buffer layer, and
   wherein a second bonding layer and a second buffer layer are provided between the second flexible substrate and the light-emitting element.

4. The light-emitting device according to claim 1, further comprising a layer provided over the first surface of the first flexible substrate,
   wherein the layer serves as a marker and includes the same material as the first crack inhibiting layer.

5. The light-emitting device according to claim 1, further comprising a light-blocking layer provided over the first surface of the first flexible substrate,
   wherein the light-blocking layer has a function of blocking light from the light-emitting element and includes the same material as the first crack inhibiting layer.

6. The light-emitting device according to claim 1, further comprising a cover layer provided over the first surface of the first flexible substrate,
   wherein the cover layer includes a portion covering the first crack inhibiting layer, and
   wherein the cover layer includes a conductive material or a resin material and is provided between the sealant and an end portion of the first flexible substrate when seen from a direction perpendicular to the first surface.

7. The light-emitting device according to claim 1,
   wherein a second crack inhibiting layer is provided over the second surface of the second flexible substrate, and
   wherein the second crack inhibiting layer includes a conductive material or a resin material and is provided between the sealant and an end portion of the first flexible substrate when seen from a direction perpendicular to the first surface.

8. A light-emitting module comprising a touch sensor over a third surface of the first flexible substrate or a fourth surface of the second flexible substrate in the light-emitting device according to claim 1,
   wherein the third surface is a surface opposite to the first surface of the first flexible substrate, and the fourth surface is a surface opposite to the second surface of the second flexible substrate.

9. A light-emitting device comprising a first flexible substrate, a second flexible substrate, a first buffer layer, a first crack inhibiting region, a light-emitting element, and a sealant,
   wherein a first surface of the first flexible substrate faces a second surface of the second flexible substrate,
   wherein the first flexible substrate is bonded to the second flexible substrate with the sealant interposed therebetween,
   wherein the first buffer layer and the first crack inhibiting region are provided over the first surface of the first flexible substrate,
   wherein the sealant is provided in a peripheral region of the first surface of the first flexible substrate,
   wherein the first crack inhibiting region is provided outside the sealant,
   wherein the first crack inhibiting region includes a plurality of first layers and a plurality of second layers,
   wherein the plurality of the first layers are provided on a first line,
   wherein the plurality of the second layers are provided on a second line,
   wherein a first gap is provided between two of the plurality of the first layers,
   wherein a second gap is provided between two of the plurality of the second layers,
   wherein a first gap overlaps with one of the plurality of the second layers when seen from a direction perpendicular to the first line and parallel to the surface of the first surface,
   wherein the first buffer layer overlaps with the first crack inhibiting region, and
   wherein the light-emitting element is provided over the second surface of the second flexible substrate.

10. The light-emitting device according to claim 9,
    wherein the first buffer layer includes an inorganic material,
    wherein the light-emitting element includes a light-emitting organic compound, and wherein each of the plurality of the first layers and each of the plurality of the second layers include a conductive material or a resin material.

11. The light-emitting device according to claim 9,
wherein a first bonding layer is provided between the first flexible substrate and the first buffer layer, and
wherein a second bonding layer and a second buffer layer are provided between the second flexible substrate and the light-emitting element.

12. The light-emitting device according to claim 9, further comprising a layer provided over the first surface of the first flexible substrate,
wherein the layer serves as a marker and includes the same material as the first layers and the second layers.

13. The light-emitting device according to claim 9, further comprising a light-blocking layer provided over the first surface of the first flexible substrate,
wherein the light-blocking layer has a function of blocking light from the light-emitting element and includes the same material as the first layers and the second layers.

14. The light-emitting device according to claim 9, further comprising a cover layer provided over the first surface of the first flexible substrate,
wherein the cover layer includes a portion covering the first crack inhibiting region, and
wherein the cover layer includes a conductive material or a resin material and is provided between the sealant and an end portion of the first flexible substrate when seen from a direction perpendicular to the first surface.

15. The light-emitting device according to claim 9,
wherein a second crack inhibiting layer is provided over the second surface of the second flexible substrate, and
wherein the second crack inhibiting layer includes a conductive material or a resin material and is provided between the sealant and an end portion of the first flexible substrate when seen from a direction perpendicular to the first surface.

16. A light-emitting module comprising a touch sensor over a third surface of the first flexible substrate or a fourth surface of the second flexible substrate in the light-emitting device according to claim 9,
wherein the third surface is a surface opposite to the first surface of the first flexible substrate, and the fourth surface is a surface opposite to the second surface of the second flexible substrate.

17. The light-emitting device according to claim 15,
wherein the second crack inhibiting layer includes a plurality of curves in which cut portions are provided in positions different from each other when seen from a direction perpendicular to the first surface.

18. The light-emitting device according to claim 1,
wherein a transistor is provided between the second surface of the second flexible substrate and the light-emitting element.

19. The light-emitting device according to claim 1,
wherein a bottom surface of the first crack inhibiting layer is in direct contact with the first buffer layer,
wherein a first surface of the sealant is in direct contact with a surface of an insulating film provided over the second surface of the second flexible substrate, and
wherein a top surface of the first crack inhibiting layer is not in direct contact with the surface of the insulating film provided over the second surface of the second flexible substrate.

20. A light-emitting device according to claim 9,
wherein a thickness of each of the plurality of the first layers and the plurality of the second layers is smaller than a thickness of the sealant.

* * * * *